(12) United States Patent
Kikuchi

(10) Patent No.: US 12,125,441 B2
(45) Date of Patent: Oct. 22, 2024

(54) LIGHT-EMITTING DEVICE, METHOD OF DRIVING LIGHT- EMITTING DEVICE, AND ELECTRONIC APPARATUS

(71) Applicant: SONY GROUP CORPORATION, Tokyo (JP)

(72) Inventor: Ken Kikuchi, Tokyo (JP)

(73) Assignee: Sony Group Corporation, Tokyo (JP)

( * ) Notice: Subject to any disclaimer, the term of this patent is extended or adjusted under 35 U.S.C. 154(b) by 0 days.

(21) Appl. No.: 18/251,347

(22) PCT Filed: Oct. 4, 2021

(86) PCT No.: PCT/JP2021/036671
§ 371 (c)(1),
(2) Date: May 1, 2023

(87) PCT Pub. No.: WO2022/102282
PCT Pub. Date: May 19, 2022

(65) Prior Publication Data
US 2024/0005861 A1 Jan. 4, 2024

(30) Foreign Application Priority Data
Nov. 10, 2020 (JP) ................. 2020-187090

(51) Int. Cl.
*G09G 3/3233* (2016.01)
*G09G 3/20* (2006.01)

(52) U.S. Cl.
CPC ......... *G09G 3/3233* (2013.01); *G09G 3/2096* (2013.01); *G09G 2310/08* (2013.01);
(Continued)

(58) Field of Classification Search
CPC ... G09G 3/30–3291; G09G 2300/0819; G09G 2300/0842–0871; G09G 2310/08
See application file for complete search history.

(56) References Cited

U.S. PATENT DOCUMENTS 5,956,004 A * 9/1999 Hush ............... H01J 31/127
345/77
6,064,357 A * 5/2000 Okuda ............... G09G 3/30
345/82

(Continued)

FOREIGN PATENT DOCUMENTS

JP 2007-333768 12/2007
JP 2011-070184 4/2011
(Continued)

OTHER PUBLICATIONS

International Search Report and Written Opinion prepared by the Japan Patent Office on Nov. 9, 2021, for International Application No. PCT/JP2021/036671, 2 pgs.

*Primary Examiner* — Amy Onyekaba
(74) *Attorney, Agent, or Firm* — Sheridan Ross PC

(57) ABSTRACT

A light-emitting device according to an embodiment of the present disclosure includes: a pixel circuit including a light-emitting part; and a gradation controller that performs gradation control. The pixel circuit includes a light emission time controller that controls a light emission time of the light-emitting part, and an amplitude modulator that includes an output transistor coupled in series to the light-emitting part. The gradation controller performs the gradation control by performing, via the light emission time controller, on/off control on the output transistor of the amplitude modulator, and modulation control on the amplitude modulator.

20 Claims, 22 Drawing Sheets

(52) U.S. Cl.
CPC ............... *G09G 2320/0233* (2013.01); *G09G 2320/0242* (2013.01); *G09G 2320/0276* (2013.01)

(56) References Cited

U.S. PATENT DOCUMENTS

| | | | | |
|---|---|---|---|---|
| 11,200,834 | B2* | 12/2021 | Kikuchi | G09G 3/2014 |
| 2003/0160775 | A1* | 8/2003 | Kumada | G09G 3/3648 |
| | | | | 345/209 |
| 2007/0279345 | A1* | 12/2007 | Kim | G09G 3/3233 |
| | | | | 345/80 |
| 2010/0253709 | A1* | 10/2010 | Kobayashi | G09G 3/2007 |
| | | | | 345/690 |
| 2010/0302285 | A1* | 12/2010 | Yamanaka | G09G 3/3233 |
| | | | | 345/76 |
| 2011/0069096 | A1 | 3/2011 | Li et al. | |
| 2012/0154682 | A1* | 6/2012 | Yamashita | G09G 3/3233 |
| | | | | 348/E9.037 |
| 2012/0212476 | A1* | 8/2012 | Yamauchi | G09G 3/3618 |
| | | | | 345/212 |
| 2013/0286001 | A1* | 10/2013 | Nakano | G09G 3/3618 |
| | | | | 345/91 |
| 2014/0218272 | A1* | 8/2014 | Kikuchi | G09G 3/3266 |
| | | | | 345/77 |
| 2014/0218414 | A1* | 8/2014 | Kikuchi | G09G 3/3233 |
| | | | | 327/434 |
| 2016/0104422 | A1* | 4/2016 | Kishi | G09G 3/006 |
| | | | | 345/205 |
| 2018/0293929 | A1* | 10/2018 | Shigeta | G09G 3/3233 |
| 2020/0111403 | A1* | 4/2020 | Kim | G09G 3/32 |
| 2020/0111404 | A1* | 4/2020 | Kim | G09G 3/2011 |
| 2020/0394953 | A1* | 12/2020 | Kim | H05B 45/33 |
| 2021/0158747 | A1 | 5/2021 | Kusunoki et al. | |
| 2021/0375185 | A1* | 12/2021 | Kim | G09G 3/32 |

FOREIGN PATENT DOCUMENTS

| | | |
|---|---|---|
| WO | WO 2018/164105 | 9/2018 |
| WO | WO 2019/220265 | 11/2019 |

* cited by examiner

STEP-LIKE SAW-TOOTH-SHAPED WAVE SIGNAL SAW

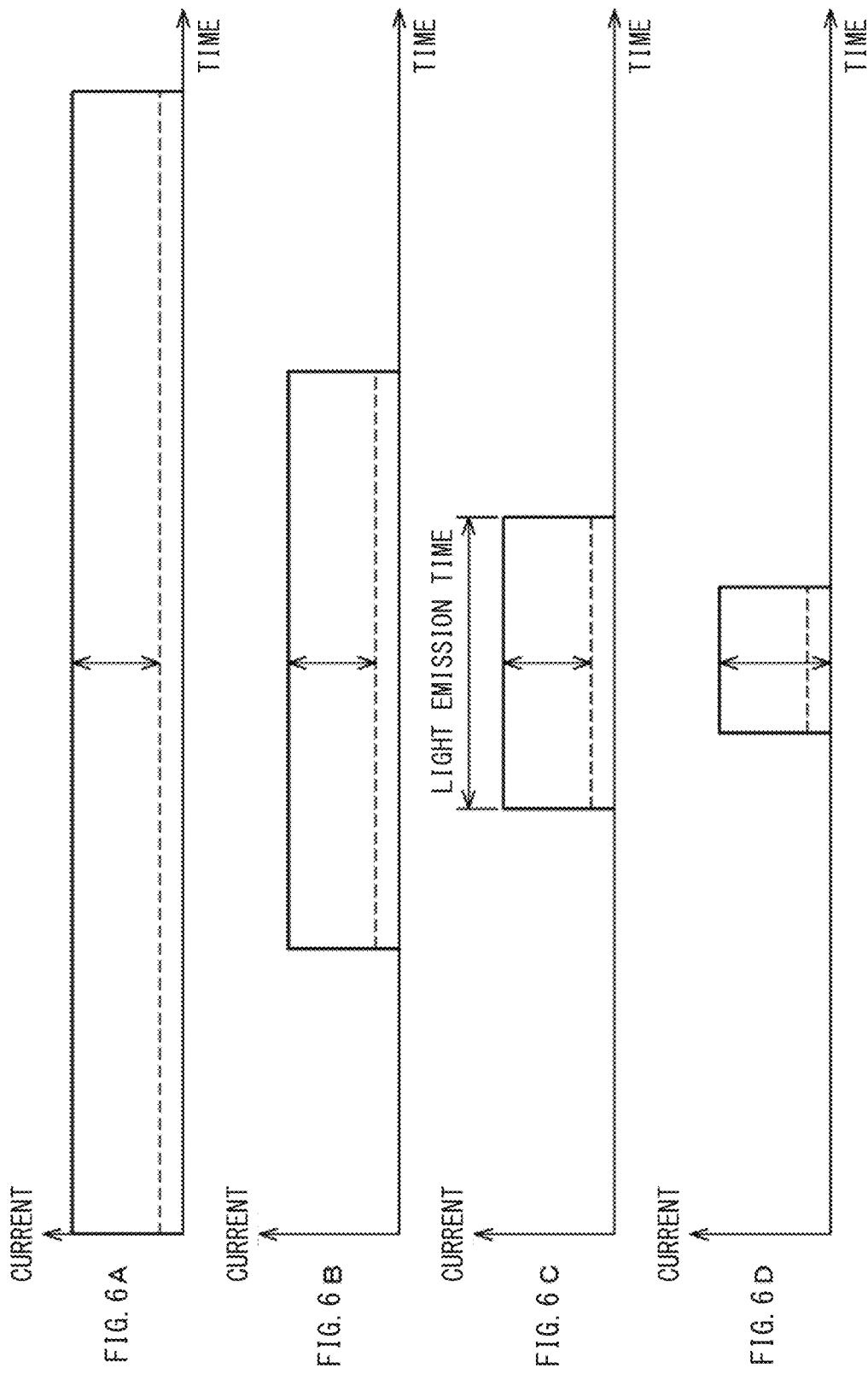

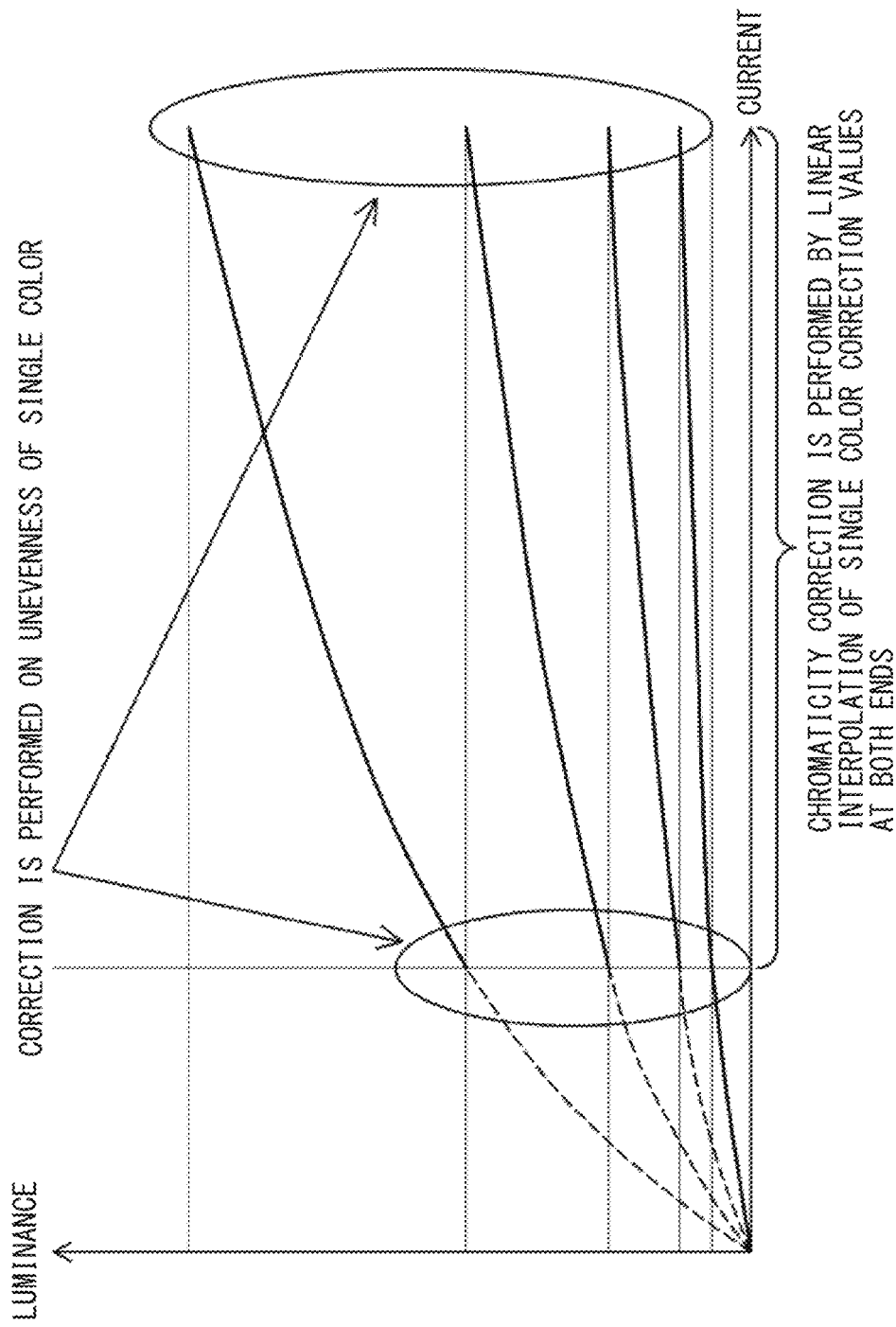

BLUR WIDTH

BLUR WIDTH

LIGHT-EMITTING DEVICE, METHOD OF DRIVING LIGHT- EMITTING DEVICE, AND ELECTRONIC APPARATUS

CROSS REFERENCE TO RELATED APPLICATIONS

This application is a national stage application under 35 U.S.C. 371 and claims the benefit of PCT Application No. PCT/JP2021/036671, having an international filing date of 4 Oct. 2021, which designated the United States, which PCT application claimed the benefit of Japanese Patent Application No. 2020-187090, filed 10 Nov. 2020, the entire disclosures of each of which are incorporated herein by reference.

TECHNICAL FIELD

The present disclosure relates to a light-emitting device, a method of driving a light-emitting device, and an electronic apparatus.

BACKGROUND ART

A light-emitting device (a so-called planar light-emitting device) in which light-emitting parts are arranged in a matrix in a row direction and a column direction (in a two-dimensional matrix shape) may be used as a self-luminous display device, a backlight device of a liquid crystal display device, or the like. Examples of the light-emitting part of the light-emitting device include a self-emitting element such as a light-emitting diode (LED) or an organic EL (electroluminescence). Among those self-emitting elements, in particular, the light-emitting diode has attracted attention as a light-emitting element of a next-generation display owing to its low degradation and high efficiency.

It is known however that the light-emitting diode has a characteristic that a spectrum is shifted to a blue side by a current (a light emission current) flowing through the element, and accordingly, a chromaticity fluctuates depending on a value of the light emission current, and there is a large luminance variation in a low current region. Thus, in a case where the light-emitting device is configured with the light-emitting diode, and if the luminance is controlled by changing the light emission current by current modulation or voltage modulation, the following issues may occur: accurate expression of color by the luminance is not possible; luminance non-uniformity occurs in a low luminance; and the like.

In order to solve such an issue, it is known that an LED display device including a light-emitting diode as a light-emitting part, for example, performs: PWM (Pulse Width Modulation) driving involving performing modulation by changing a duty cycle of a light emission section; and subfield driving involving performing driving by dividing one field into a plurality of subfields. PTL 1 (Japanese Unexamined Patent Application Publication No. 2007-333768) discloses a technique using PWM driving and a technique using subfield driving for driving a light-emitting part.

CITATION LIST

Patent Literature

PTL 1: Japanese Unexamined Patent Application Publication No. 2007-333768

SUMMARY OF THE INVENTION

Incidentally, high-resolution PWM driving is vulnerable to noises and fluctuations, and necessitates a circuit configuration of a large circuit scale for implementation thereof. There are also many display devices utilizing PWM driving of a passive matrix, but such display devices have the following issues: a luminance is low due to not being able to have a large light emission duty; increase in resolution increases the number of drivers, resulting in high cost; and the like.

In contrast, subfield driving does not necessitate a large circuit scale as compared with the PWM driving. However, the subfield driving has a linear gamma characteristic, and there is an issue of insufficient resolution of a low gradation in particular. Further, in the subfield driving, there is an issue of a pseudo contour of the moving image caused by the light emission of the subfield.

Some issues have been described by exemplifying an LED display device including a light-emitting diode as a light-emitting part, however, the those described above are issues not only for the LED display device including the light-emitting diode as the light-emitting part, but also for a general light-emitting device in which self-emitting elements are arranged in a two-dimensional matrix.

It is desirable to provide a light-emitting device, a method of driving a light-emitting device, and an electronic apparatus including the light-emitting device which are resistant to noises, fluctuations, and the like with a simple circuit configuration, and have high gradation performance and small chromaticity change without use of, to a possible extent, a low current region that causes many issues in driving the light-emitting diode in particular.

A light-emitting device according to an embodiment of the present disclosure includes:

a pixel circuit including a light-emitting part; and
a gradation controller that performs gradation control, in which
the pixel circuit includes
a light emission time controller that controls a light emission time of the light-emitting part, and
an amplitude modulator that includes an output transistor coupled in series to the light-emitting part, and
the gradation controller performs the gradation control by performing, via the light emission time controller, on/off control on the output transistor of the amplitude modulator, and modulation control on the amplitude modulator.

According to a method of driving a light-emitting device according to an embodiment of the present disclosure,
the light-emitting device includes
a pixel circuit including a light-emitting part, and
a gradation controller that performs gradation control,
the pixel circuit includes
a light emission time controller that controls a light emission time of the light-emitting part, and
an amplitude modulator that includes an output transistor coupled in series to the light-emitting part, and
the method includes, in the light-emitting device, performing the gradation control by performing on/off control on the output transistor of the amplitude modulator, and by performing modulation control on the amplitude modulator, under control of the gradation controller.

An electronic apparatus according to an embodiment of the present disclosure includes a light-emitting device, the light-emitting device including:

a gradation controller that performs gradation control, in which
the pixel circuit includes
a light emission time controller that controls a light emission time of the light-emitting part, and
an amplitude modulator that includes an output transistor coupled in series to the light-emitting part, and
the gradation controller performs the gradation control by performing, via the light emission time controller, on/off control on the output transistor of the amplitude modulator, and modulation control on the amplitude modulator.

BRIEF DESCRIPTION OF DRAWINGS

FIGS. 6A to 6D are each a diagram illustrating a state of discretely controlling a light emission time under a driving method according to Embodiment 3.

FIG. 11 is a diagram for explaining the chromaticity correction based on the driving method according to Embodiment 4.

MODES FOR CARRYING OUT THE INVENTION

Figure 1:
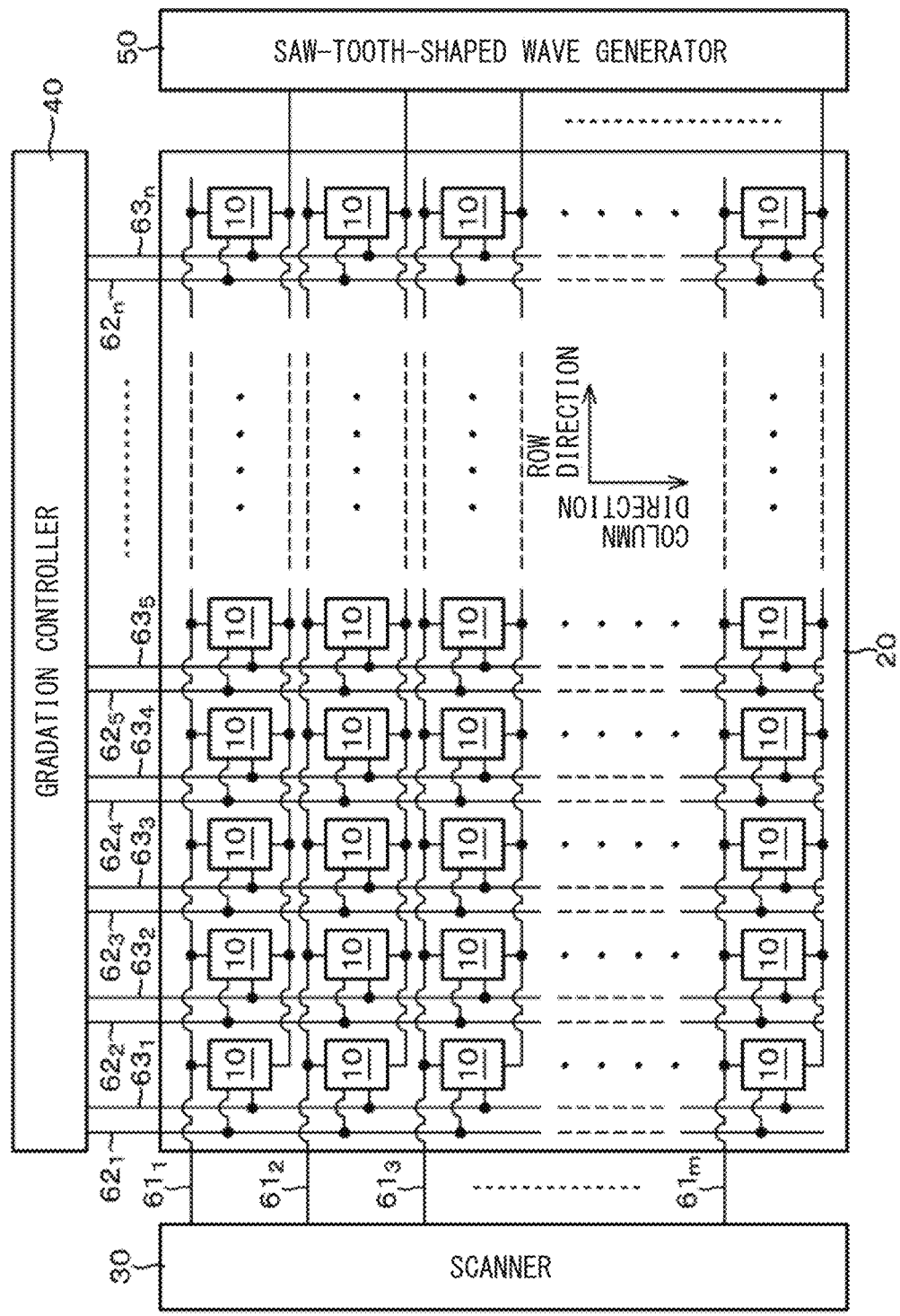
FIG. 1 is a conceptual diagram of a circuit included in a light-emitting device according to an embodiment of the present disclosure.

The following describes modes (hereinafter, referred to as "Embodiments") for carrying out the technology of the present disclosure in detail with reference to the drawings. However, the technology of the present disclosure is not limited to the following embodiments. In the following description, components that are the same as each other or that have the same function are denoted by the same reference signs, and thus redundant description thereof is omitted. It is to be noted that description is given in the following order.
1. Overall Description of Light-Emitting Device, Method of Driving Light-Emitting Device, and Electronic Apparatus According to Present Disclosure
2. Light-Emitting Device According to Embodiments of Present Disclosure
2-1. Embodiment 1 (Circuit Example of Pixel Circuit in Case of Current Modulation)
2-2. Reference Example (Example of Disposing Switch Element in Current Path of Light-Emitting Part)
2-3. Embodiment 2 (Circuit Example and Operation Example of Light Emission Time Controller in Pixel Circuit According to Embodiment 1)
2-4. Embodiment 3 (Example of Control Method Including Performing Gradation Control Using Pixel Circuit According to Embodiment 1)
2-5. Embodiment 4 (Example of Control Method Including Performing Chromaticity Correction in Current Region to be Used in Gradation Control)

2-6. Embodiment 5 (Specific Circuit Example of Current Modulator in Pixel Circuit According to Embodiment 1)
2-7. Embodiment 6 (Specific Circuit Example and Operation Waveform Example of Saw-Tooth-Shaped Wave Generator)
2-8. Embodiment 7 (Example of Driving Method for Maintaining Satisfactory Moving-Image Characteristic When Light Emission Duty Is Discretely Varied)
2-9. Embodiment 8 (Example of Being Provided with Re-Shooting Mode)
2-10. Embodiment 9 (Circuit Example of Pixel Circuit in Case of Voltage Modulation)
3. Modification Example
4. Electronic Apparatus According to Present Disclosure
4-1. First Specific Example (Example of Tiled Display)
4-2. Second Specific Example (Example of Back Light Device of Liquid Crystal Display Device)
5. Configurations to Which Present Disclosure Is Applicable <Overall Description of Light-Emitting Device, Method of Driving Light-Emitting Device, and Electronic Apparatus According to Present Disclosure>

According to a light-emitting device, a method of driving a light-emitting device, and an electronic apparatus of the present disclosure: a light emission time controller may be configured to control, under control of a gradation controller, a light emission time of a light-emitting part by performing on/off control on an output transistor of an amplitude modulator; and the amplitude modulator may be configured to control, under control of the gradation controller, a value of a current that flows through the light-emitting part or a value of a voltage that is applied to the light-emitting part depending on the light emission time of the light-emitting part. Further, the amplitude modulator may be configured to include a current modulator that controls the value of the current that flows through the light-emitting part or a voltage modulator that controls the value of the voltage that is applied to the light-emitting part.

According to the light-emitting device, the method of driving the light-emitting device, and the electronic apparatus of the present disclosure including the preferred configurations described above, in a case where a saw-tooth-shaped wave generator that generates a step-like saw-tooth-shaped wave signal is provided, the light emission time controller may be configured to control the light emission time of the light-emitting part on the basis of the step-like saw-tooth-shaped wave signal to be generated by the saw-tooth-shaped wave generator. Further, the saw-tooth-shaped wave generator may be configured to generate the step-like saw-tooth-shaped wave signal for each of pixel rows of a pixel array in which pixel circuits are disposed in rows and columns, and the light emission time controller may be configured to control the light emission time of the light-emitting part for each of the pixel rows on the basis of the step-like saw-tooth-shaped wave signal to be generated by the saw-tooth-shaped wave generator. In addition, the saw-tooth-shaped wave generator may be configured to generate the step-like saw-tooth-shaped wave signal by a sample hold circuit.

Further, according to the light-emitting device, the method of driving the light-emitting device, and the electronic apparatus of the present disclosure including the preferred configurations described above, the gradation controller may be configured to discretely reduce the light emission time of the light-emitting part at a fixed rate. Further, the gradation controller may be configured to control the light emission time of the light-emitting part and a value of a current that flows through the light-emitting part in such a manner that a characteristic of a current versus a luminance approaches a gamma characteristic of a logarithmic curve. Further, where $\alpha$ is a number smaller than 1, and a luminance of the light-emitting part is $\alpha$-fold of a maximum value, for any gamma curve, the gradation controller may be configured to multiply a light emission duty by $\alpha$ in a gradation whose luminance becomes the $\alpha$-fold, make the gamma curve variable in such a manner as to allocate a step interval of an amplitude gradation in accordance with the gradation interval, and make the gamma curve variable in such a manner that the amplitude gradation becomes the $\alpha$-fold in the interval.

Further, according to the light-emitting device, the method of driving the light-emitting device, and the electronic apparatus of the present disclosure including the preferred configurations described above, the gradation controller may be configured to set a change ratio of one light emission of a light emission duty in a light emission period within one frame to less than or equal to a predetermined proportion, the change ratio being based on when the light emission time of the light-emitting part is discretely controlled.

Further, according to the light-emitting device, the method of driving the light-emitting device, and the electronic apparatus of the present disclosure including the preferred configurations described above, the gradation controller may be configured to use a particular light emission current range of the light-emitting part except for a minimum light emission time width of the light-emitting part, and to perform chromaticity correction of a single color in a section of the particular current range of the light-emitting part. In addition, the gradation controller may be configured to perform the chromaticity correction of the single color using a technique of an interpolation process, and to perform the chromaticity correction of the single color by the interpolation process of two or more current values.

Further, according to the light-emitting device, the method of driving the light-emitting device, and the electronic apparatus of the present disclosure including the preferred configurations described above, the light-emitting device may be configure to have a re-shooting mode in which light emission in one frame period is divided into a plurality of times, and a light emission duty is not changed periodically. Further, a light-emitting element of the light-emitting part may be configured to include a light-emitting diode.

Further, according to the light-emitting device, the method of driving the light-emitting device, and the electronic apparatus of the present disclosure including the preferred configurations described above, the light-emitting element of the light-emitting part may include the light-emitting diode. The light-emitting diode may have a known configuration or a known structure. In other words, a light-emitting diode having an optimum configuration and an optimum structure and including an appropriate material may be selected depending on an emission color of the light-emitting diode.

According to the light-emitting device including the light-emitting diode as the light-emitting part: a light-emitting part including a red light-emitting diode functions as a red light-emitting sub-pixel, a light-emitting part including a green light-emitting diode functions as a green light-emitting sub-pixel, and a light-emitting part including a blue light-emitting diode functions as a blue light-emitting sub-pixel. Three sub-pixels configure one pixel serving as a unit for forming a color image. In other words, it is possible to display the color image in accordance with a light emission state of the three sub-pixels. It is to be noted that "one pixel" in the present disclosure corresponds to "one sub-pixel" in such a light-emitting device, and thus, the "one sub-pixel" in such a light-emitting device may be read as "one pixel".

<Light-Emitting Device According to Embodiments of Present Disclosure>

FIG. 1 is a conceptual diagram of a circuit configuring a light-emitting device according to an embodiment of the present disclosure. The light-emitting device according to an embodiment of the present disclosure embodiment (hereinafter, may be referred to as the "present embodiment") includes a pixel array 20 in which a plurality of pixel circuits 10 each including a light-emitting part that configures a pixel (more specifically, a sub-pixel, and the same applies hereinafter) is arranged in a matrix shape (a two-dimensional matrix shape) in a row direction and in a column direction.

The light-emitting device according to the present embodiment further includes, for example, a scanner (a scan line driver) 30, a gradation controller 40, a saw-tooth-shaped wave generator 50, and the like, which are disposed around the pixel array 20 and serve as peripheral drivers for driving the plurality of pixel circuits 10.

The scanner 30 drives the plurality of pixel circuits 10 through scan lines $61_1$ to $61_m$ wired for each pixel row to a pixel arrangement of m rows and n columns which are arranged in the two-dimensional matrix.

The gradation controller 40 supplies a modulation signal (I-Sig/V-Sig) and a light emission time control signal (D-Sig) to each of the plurality of pixel circuits 10 through control lines $62_1$ to $62_m$ and control lines $63_1$ to $63_m$ to the pixel arrangement of m rows and n columns, and performs gradation control for each pixel. Two control lines 62 and 63 are wired for each pixel column.

The saw-tooth-shaped wave generator 50 generates a saw-tooth-shaped wave signal having a waveform illustrated in FIG. 2, that is, a saw-tooth-shaped wave signal (hereinafter referred to as "step-like saw-tooth-shaped wave signal") SAW whose level changes in a stepwise manner. Here, assuming a case where the light-emitting device is used as a display device for displaying a video, in many cases, the display device writes a signal for each line (pixel row), starts light emission of the relevant scan line, and thereafter shifts to writing of a signal of the subsequent line. Accordingly, in accordance with the operation, the saw-tooth-shaped wave generator 50 supplies the generated step-like saw-tooth-shaped wave signal SAW to each of the pixel circuits 10 of the pixel array 20 for each pixel row. However, depending on a circuit configuration, the saw-tooth-shaped wave signal of the waveform illustrated in FIG. 2 may be upside down.

Some or all of the peripheral drivers including the scanner (the scan line driver) 30, the gradation controller 40, the saw-tooth-shaped wave generator 50, and the like may be provided on the same substrate as the pixel array 20, or may be provided outside the substrate.

The light-emitting device having the above-described configuration according to the embodiment of the present disclosure may be used as an LED display device in which the light-emitting part of the pixel circuit includes the light-emitting diode, and may be used as an organic EL display device in which the light-emitting part of the pixel circuit includes an organic EL element.

Hereinafter, specific embodiments of a circuit included in the light-emitting device according to the embodiment of the present disclosure will be described. It is to be noted that current modulation and voltage modulation may be considered as amplitude modulation for controlling luminance by changing light emission current of the light-emitting part of the pixel (the sub-pixel). In the case of the current modulation, the current modulator is to be used as the amplitude modulator, and in a case of the voltage modulation, the voltage modulator is to be used as the amplitude modulator.

Embodiment 1

Figure 3:
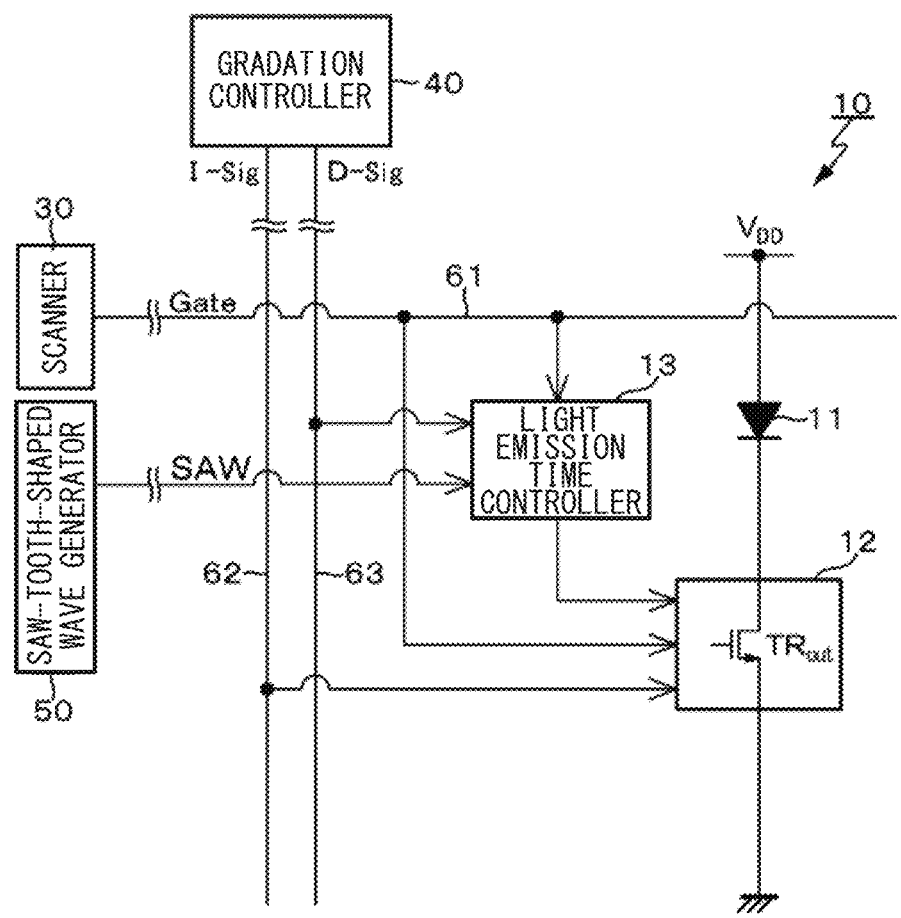
FIG. 3 is a circuit diagram illustrating an example of a circuit configuration of a pixel circuit according to Embodiment 1.

Embodiment 1 is a circuit example of a pixel circuit 10 of the case of the current modulation. FIG. 3 illustrates an example of a circuit configuration of the pixel circuit 10 according to Embodiment 1.

In the case of the current modulation, the pixel circuit 10 has a circuit configuration including a light-emitting part 11, a current modulator 12, and a light emission time controller 13. As a light-emitting element of the light-emitting part 11, a self-emitting element such as a light-emitting diode (LED) or an organic EL element may be used.

The pixel circuit 10 according to Embodiment 1 includes the light-emitting diode (LED) as the light-emitting element of the light-emitting part 11. An anode electrode of the light-emitting element of the light-emitting part 11, i.e., the light-emitting diode, is coupled to a power supply line of a power supply voltage $V_{DD}$. It is known that the light-emitting diode has a so-called blue shift in which a spectrum is shifted to a blue side by a current (light emission current) flowing through the element, and thus, a chromaticity fluctuates depending on a value of the light emission current, and there is a large luminance variation in a low current region.

The current modulator 12 has an output transistor $TR_{out}$ coupled in series to the light-emitting part 11, and controls a light emission time of the light-emitting part 11 to control the value of the current that flows through the light-emitting part 11 depending on the light emission time of the light-emitting part 11. The output transistor $TR_{out}$ includes, for example, an N-channel field effect transistor, and has a drain electrode coupled to the anode electrode of the light-emitting part 11 and a source electrode coupled to a reference potential node (e.g., a ground).

The current modulator 12 turns into an operating state in response to a scan signal Gate provided from the scanner 30 via the scan line 61 ($61_1$ to $61_m$). Thereafter, the current modulator 12 controls, in response to the current modulation signal I-Sig which is provided as the modulation signal from the gradation controller 40 via the control line 62 ($62_1$ to $62_m$), the value of the current that flows through the light-emitting part 11, that is, the current value of the light emission current of the light-emitting diode.

The light emission time controller 13 receives the scan signal Gate from the scanner 30 via the scan line 61 ($61_1$ to $61_m$), the light emission time control signal D-Sig from the gradation controller 40 via the control line 63 ($63_1$ to $63_m$), and the step-like saw-tooth-shaped wave signal SAW from the saw-tooth-shaped wave generator 50. The light emission time controller 13 turns into an operating state in response to the scan signal Gate, and controls the light emission time of the light-emitting part 11 on the basis of the step-like saw-tooth-shaped wave signal SAW and the light emission time control signal D-Sig. By controlling the light emission time, a proportion of the light emission time in a period of one frame (one display frame) which is a unit for displaying one image, that is, a light emission duty (Duty), is controlled.

Further, the light emission time controller 13 performs, under control of the gradation controller 40, on/off control on the output transistor $TR_{out}$ of the current modulator 12.

Under the control of the light emission time controller 13, the output transistor $TR_{out}$ of the current modulator 12 selectively blocks the current flowing through the light-emitting part 11. In other words, the current modulator 12 has a mechanisms for selectively blocking the current flowing through the light-emitting part 11.

On the pixel circuit 10 having the above-described configuration, the gradation controller 40 performs gradation control (gradation expression) by controlling the current modulator 12 and the light emission time controller 13. Specifically, the gradation controller 40 performs the gradation expression by: performing control of discretely (in a stepwise manner) reducing the light emission time of the light-emitting part 11 at a fixed rate by the on/off control of the output transistor $TR_{out}$ of the current modulator 12 to be performed by the light emission time controller 13; and controlling the value of the current that flows through the light-emitting part 11 by the current modulator 12 depending on the light emission time of the light-emitting part 11.

As described above, the pixel circuit 10 according to Embodiment 1 has the configuration in which the light emission time is determined discretely for each pixel by the on/off control of the output transistor $TR_{out}$ to be performed by the current modulator 12. According to the pixel circuit 10 of Embodiment 1 having such a configuration, it is possible to change the light emission time to be rough in a stepwise manner by the on/off control of the output transistor $TR_{out}$, to perform the current modulation finely under the control of the gradation controller 40 in accordance with the light emission time determined by the on/off control of the output transistor $TR_{out}$, and to achieve driving using only a current value in a particular range.

Figure 2:
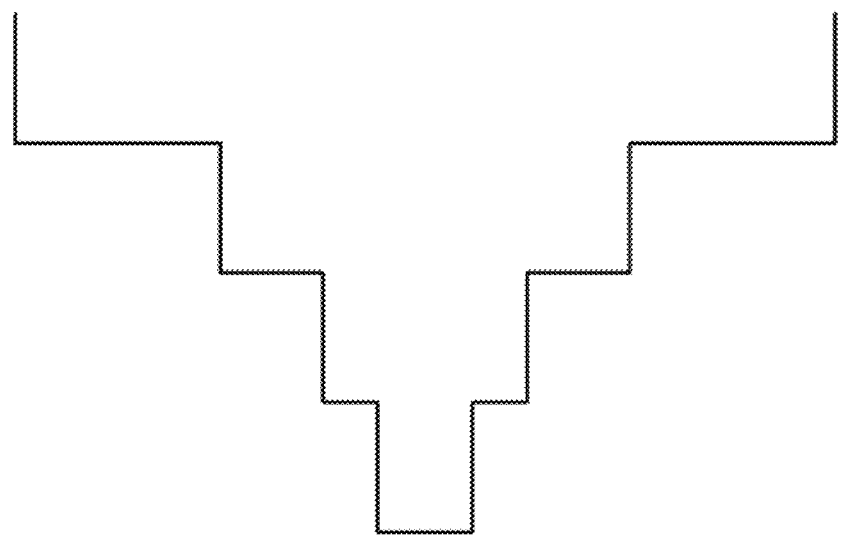
FIG. 2 is a waveform diagram illustrating a step-like saw-tooth-shaped wave signal SAW.

As described above, if it is possible to discretely change the light emission time of the light-emitting part 11, it is possible to control the light emission time with high accuracy even with a simple circuit configuration by, for example, setting a level difference of the step waveform larger than a level of a noise using the step-like saw-tooth-shaped wave signal SAW illustrated in FIG. 2. The noise described here is a potential fluctuation and the like caused by a power supply fluctuation when the light-emitting part 11 emits light, and the noise level varies depending on a circuit form of the pixel circuit 10.

Comparative Example

Incidentally, it is also possible to achieve a pixel circuit that controls a detailed gradation by current modulation while discretely controlling the light emission time, by having a configuration in which: a switch element is disposed in a current path of the light-emitting part 11; and switching control of the switch element and modulation control of the current modulator 12 are performed under control of the gradation controller 40. Hereinafter, the pixel circuit having the configuration in which the switch element is disposed in the current path of the light-emitting part 11 will be described as a pixel circuit according to a reference example.

According to the pixel circuit of the reference example, a discrete time amplitude modulation that makes it possible to be varied only within a time width that is set in advance may be introduced. This makes it possible to limit a current region to be used in most sections while eliminating issues of variation in a PWM circuit and noise-weakness, and to avoid a change in the emission color and variation in the low current region due to the current value of the light emission current.

However, in the pixel circuit according to the reference example, the light emission current flows through the switch element that blocks the current, and this causes an issue that a power supply voltage increases due to the voltage at both ends of the switch element, which increases power consumption to the extent of the increase. Further, in a case where the switch element is includes a field effect transistor or the like in order to suppress the increase in the power supply voltage, it is necessary to increase a size of the element, which is a disadvantageous circuit configuration from a viewpoint of reducing a circuit scale.

Incidentally, an LED display device including TFT (Thin Film Transistor) in which it is not possible to include a complicated and large-scale circuit, a micro LED display device including a CMOS backplane, a back light device of a liquid crystal display device of a case where a micro LED element is to be driven by TFT or a micro CMOS element, and the like each have issues of the luminance variation in the low current region, a chromaticity change due to the light emission current, and the like. In those environments, there are many use cases in which an extremely large light emission current is controlled with respect to an element size, and it is thus desired to reduce the circuit scale. Therefore, from the viewpoint of reducing the circuit scale, it is not preferable to use the pixel circuit according to the reference example.

In contrast, according to the pixel circuit 10 of Embodiment 1, it is possible to configure a small-scale circuit of a small signal without using the switch element that may be relatively large in size for flowing the light emission current, and it is possible to solve the issues of the pixel circuit according to the reference example in which the power supply voltage increases and the power consumption increases by placing the switch element in the path of the large light emission current.

Reference Example

Here, a specific circuit configuration of the light emission time controller 13 will be considered. The light emission time controller 13 may control the light emission time of the light-emitting part 11 by generating, on the basis of the light emission time control signal D-Sig sent from the gradation controller 40, a signal that controls light emission start and light emission end of the light-emitting part 11, and sending the signal to the current modulator 12. Many circuit configurations are conceivable as the light emission time controller 13. Simply conceivable as the light emission time controller 13 is a circuit configuration that generates a light emission period pulse which goes up at a time of the light emission start and goes down at a time of the light emission end. The light emission period pulse signal may occur a plurality of times during a one frame period.

It is also conceivable that the light emission period pulse signal may be generated, for example, by a clock count of a counter circuit for an integer value sent from the gradation controller 40. Although the circuit including the counter is already complicated, it is conceivable to reduce the count number by slowing the clock so as to make the circuit as simple as possible. The resulting time width is rough and discrete.

Figure 4A:
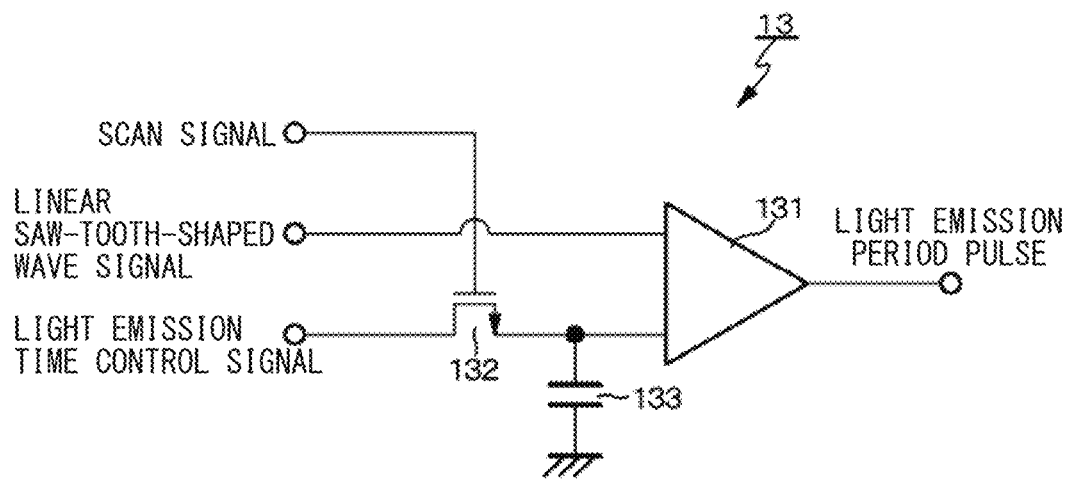
FIG. 4A is a circuit diagram illustrating a circuit example of a light emission time controller according to a reference example.
Figure 4B:
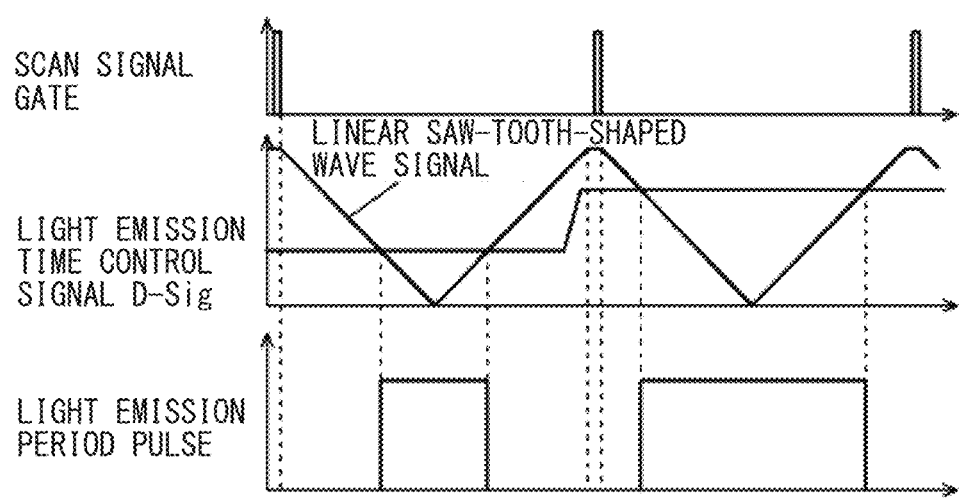
FIG. 4B is a waveform diagram for explaining an operation example of the light emission time controller according to the reference example.

Here, as the light emission time controller 13 that generates the light emission period pulse signal, a brief circuit configuration illustrated in FIG. 4A is exemplified as a reference example. FIG. 4A illustrates a circuit example of the light emission time controller 13 according to the reference example, and FIG. 4B is a waveform diagram for explaining an operation example of the light emission time controller 13 according to the reference example.

As illustrated in FIG. 4A, the light emission time controller 13 according to the reference example exemplified here has a circuit configuration including a comparator 131, an N-channel field effect transistor 132, and a capacitor 133. The light emission time controller 13 according to the reference example compares a saw-tooth-shaped wave signal whose level changes linearly (hereinafter, referred to as "linear saw-tooth-shaped wave signal") and a DC signal with each other compared by the comparator 131, and outputs a pulse of a section of the linear saw-tooth-shaped wave signal that is cut off by the DC signal as the light emission period pulse signal, as illustrated in FIG. 4B.

However, the light emission time controller 13 according to the reference example having the above-described circuit configuration is extremely vulnerable to noises and fluctuations, and the light emission period pulse signal fluctuates even for slight thermal properties and variations of the comparator 131 if a noise rides on the linear saw-tooth-shaped wave signal. Accordingly, the pixel circuit 10 may increase in circuit scale and may become complicated and expensive, as it is necessary to stabilize the waveform of the linear saw-tooth-shaped wave signal by lowering impedance of a wiring line of the linear saw-tooth-shaped wave signal, and to use the comparator 131 with little variation, for example.

Embodiment 2

Figure 5A:
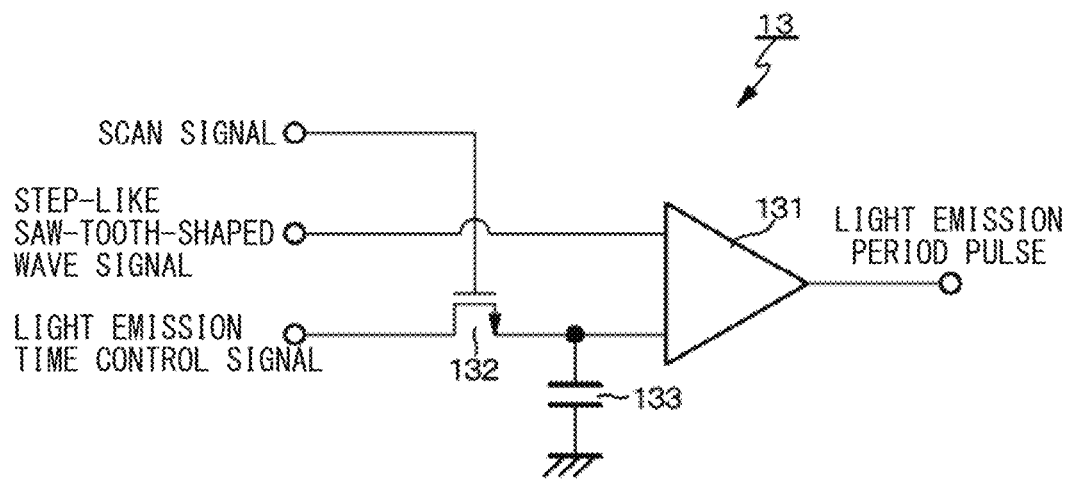
FIG. 5A is a circuit diagram illustrating a circuit example of a light emission time controller according to Embodiment 2.
Figure 5B:
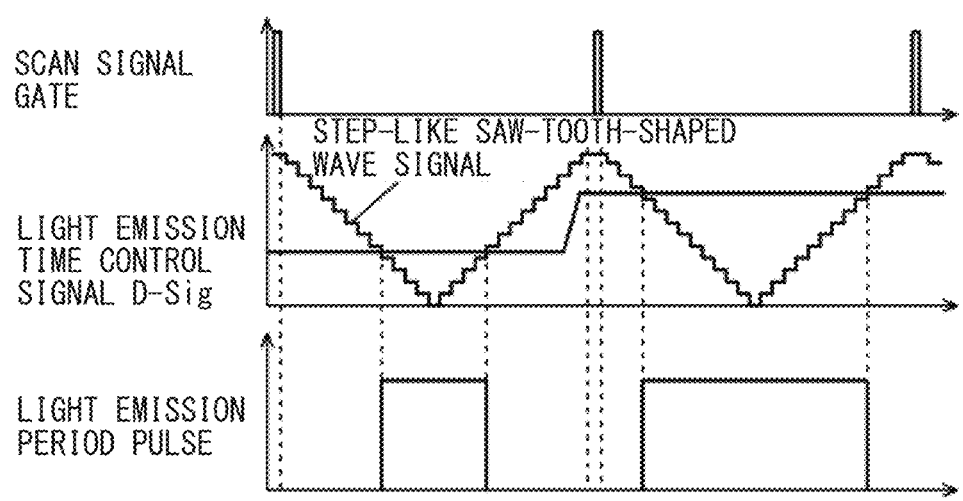
FIG. 5B is a waveform diagram for explaining an operation example of the light emission time controller according to Embodiment 2.

Embodiment 2 is a circuit example and an operation example of a light emission time controller that is able to avoid a malfunction of the light emission time controller according to the reference example. FIG. 5A illustrates a circuit example of the light emission time controller 13 according to Embodiment 2, and FIG. 5B illustrates a waveform diagram for explaining an operation example of the light emission time controller 13 according to Embodiment 2.

The light emission time controller 13 according to Embodiment 2 includes the comparator 131, the N-channel field effect transistor 132, and the capacitor 133. The basic circuit configuration is the same as that of the light emission time controller according to the reference example, but differs in the following points. That is, in the light emission time controller according to the reference example, the comparator 131 compares the linear saw-tooth-shaped wave signal and the DC signal with each other, whereas in the light emission time controller 13 according to Embodiment 2, the comparator 131 compares the step-like saw-tooth-shaped wave signal illustrated in FIG. 2 and the DC signal with each other.

As described above, the light emission time controller 13 according to Embodiment 2 uses the step-like saw-tooth-shaped wave signal, instead of the linear saw-tooth-shaped wave signal, as the saw-tooth-shaped wave signal, and limits in advance an available light emission width. As a result, a noise up to a height of the step waveform of the step-like saw-tooth-shaped wave signal is less likely to influence the light emission width.

Embodiment 3

Embodiment 3 is an example of a driving method (that is, a method of driving a light-emitting device) for performing gradation control in the pixel circuit according to Embodiment 1 using the step-like saw-tooth-shaped wave signal.

The gradation control according to the driving method of Embodiment 3 is performed by, in the pixel circuit 10 according to Embodiment 1, under the control of the gradation controller 40: control of the current value of the light-emitting part 11 by the current modulator 12; and the on/off control of the output transistor $TR_{out}$ of the current modulator 12 by the light emission time controller 13.

Here, considered is a gradation change of a case where the pixel circuit 10 according to Embodiment 1 reduces the luminance from a state of a maximum light emission current value at a maximum light emission duty, for example.

As described above, the gradation controller 40 performs control to discretely reduce the light emission time of the light-emitting part 11 at a fixed rate. Specifically, in a case where the current is reduced from when the luminance of the light-emitting part 11 has the maximum value until when the luminance of the light-emitting part 11 becomes α-fold, where α is a number smaller than 1, in the subsequent gradation, the light emission duty is multiplied by α to return the current to a maximum value. In this light emission duty, the current is reduced again, and, when the luminance becomes α-fold, the light emission duty is multiplied by α again to return the current to the maximum value. Repeating this operation makes it possible to reduce the luminance without changing a variable range of the current, and to obtain the largest number of gradations.

In contrast, in a case where the light emission duty is set to a value larger than α-fold when the current is reduced until the luminance becomes α-fold, the current does not return to the maximum value in the case of determining the subsequent gradation. Conversely, it is possible to express the previous gradation by a new light emission duty, and as a result, there is an intersection of gradations between respective discrete light emission duties. Alternately using the intersecting gradations for each frame makes it also possible to alleviating a pseudo-contour and a chromaticity difference between the light emission duties.

Figure 7:
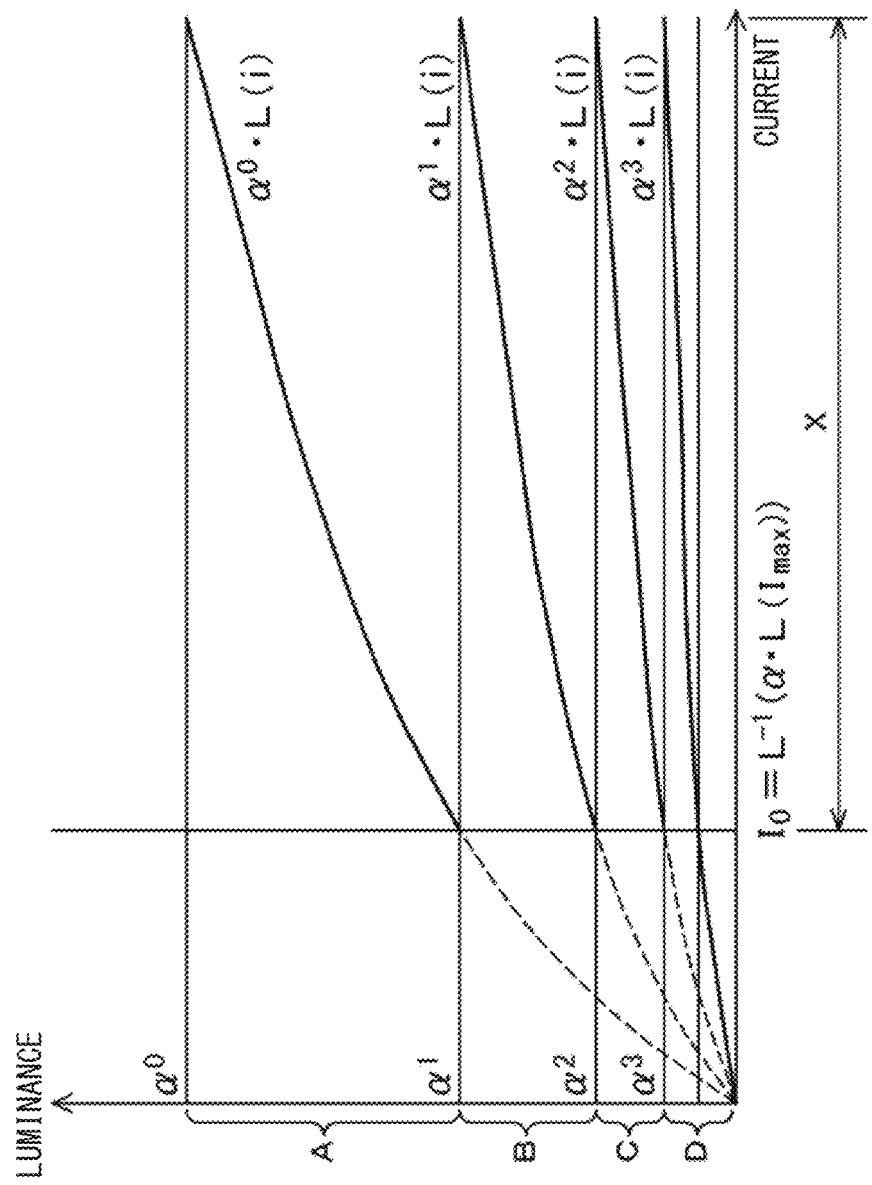
FIG. 7 is a characteristic diagram illustrating a curve characteristic of a current versus a luminance associated with discrete control on a light emission duty.

As described above, a state of discretely controlling the light emission time is illustrated in FIGS. 6A to 6D. By performing such discrete control of the light emission time, a characteristic of the current versus the luminance may be brought into a curve characteristic as illustrated in FIG. 7. In a characteristic diagram illustrated in FIG. 7, luminance ranges A to D correspond to respective light emission times of FIGS. 6A to 6D. The characteristic diagram illustrated in FIG. 7 exemplifies a 2-bit 4-step case. Here, a luminance $L(I_0)$ is represented by the following equation, where a maximum light emission current value is represented by $I_{max}$ and a light emission current at which the luminance becomes α-fold is represented by $I_0$.

$$L(I_0)=\alpha \cdot L(I_{max})$$

As illustrated in the characteristic diagram of FIG. 7, the pixel circuit 10 according to Embodiment 1 is able to express many luminance gradations using only a certain limited current section X, by using the driving method according to Embodiment 3. In other words, it is possible to express many luminance gradations by using only a particular light emission current range X except for a minimum light emission time width of the light-emitting part 11. This makes it possible to suppress an influence of the chromaticity change of the light-emitting part 11 due to the light emission current to be small. Further, if it is possible to make the minimum light emission time to be small to a certain extent, the gradation lower than that is able to be expressed by error diffusion, which is one of dithering methods.

Therefore, it is possible to express the entire gradations without using a low current region having a large luminance variation.

Figure 8:
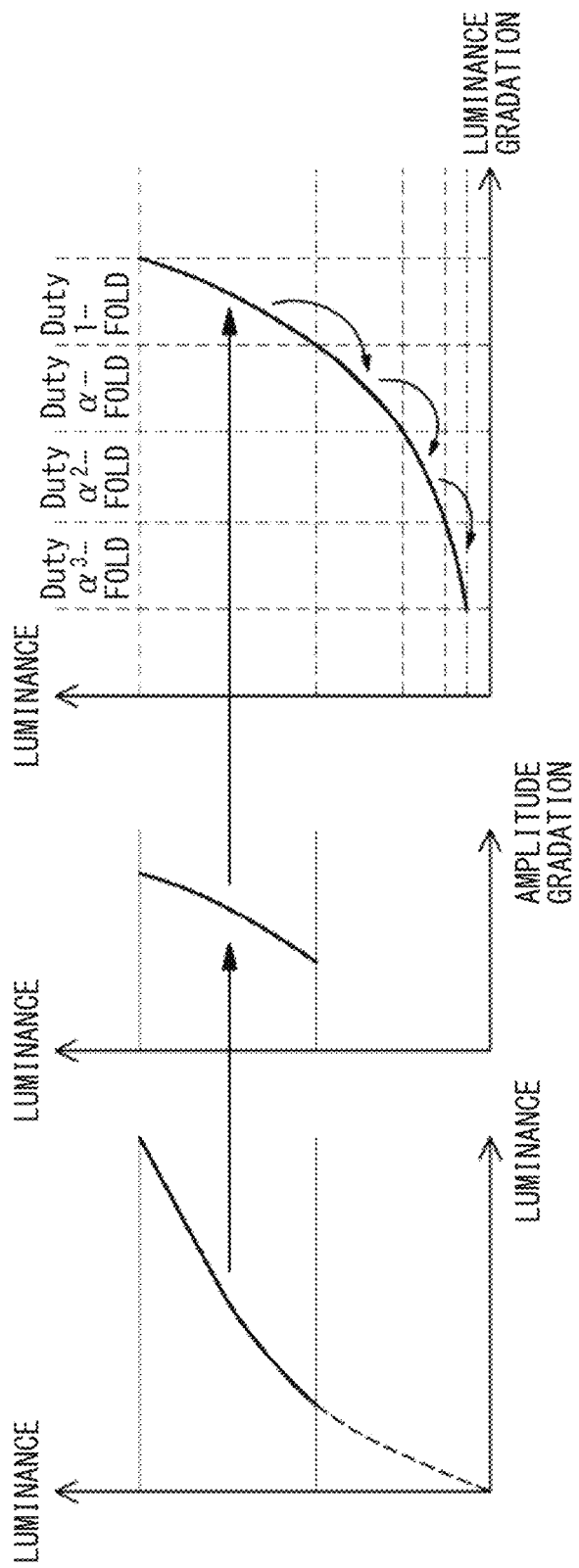
FIG. 8 is a diagram for explaining generation of a gamma curve for a luminance gradation.

As described above, in the case where the current is reduced and the luminance becomes α-fold, and, in the subsequent gradation, the light emission duty is multiplied by α to return the current to the maximum value. In the case of performing such an operation, a table of values of registers of the current control is created to define an amplitude gradation that controls the current to be slightly downward convex or substantially linear. As illustrated in FIG. 8, it is possible to generate a gamma curve for the luminance gradation, by arranging the light emission duties toward a lower gradation while multiplying the light emission duties by α.

Figure 9A:
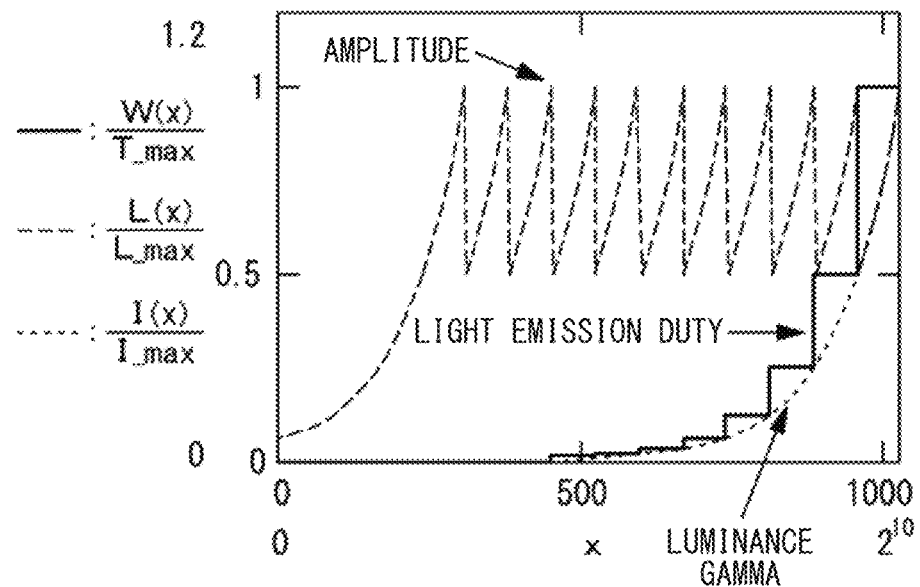
FIG. 9A is a characteristic diagram of a logarithmic luminance gamma characteristic.

Arranging the light emission duties toward the lower gradation while multiplying the light emission duties by a makes it possible to achieve a luminance gamma characteristic having a form of a logarithmic curve as illustrated in FIG. 9A, that is, a logarithmic luminance gamma characteristic. In other words, the gradation controller 40 controls the light emission duty of the light-emitting part 11 and the value of the current that flows through the light-emitting part 11 in such a manner that the characteristic of the current versus the luminance approaches a gamma characteristic of the logarithmic curve.

Figure 9B:
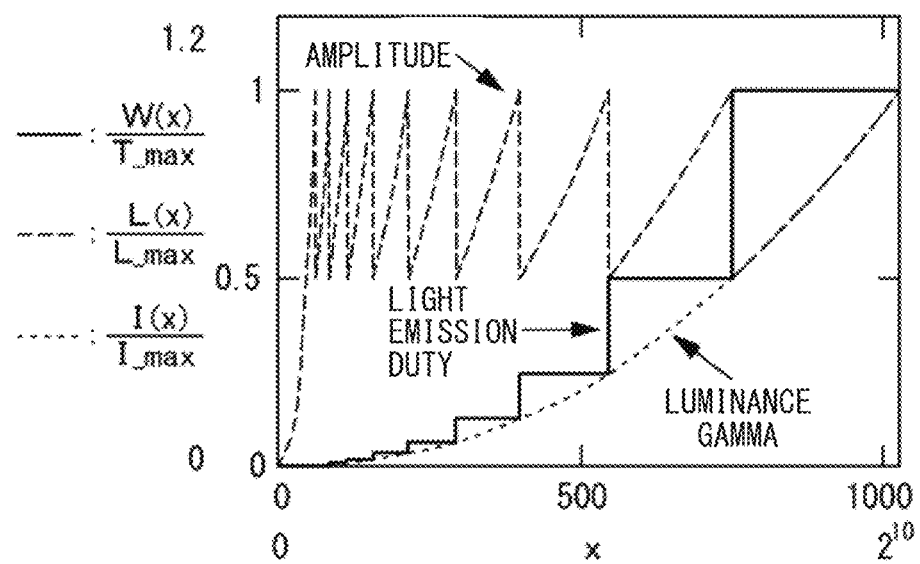
FIG. 9B is a characteristic diagram of a luminance gamma characteristic of an optional curve.

Further, it is assumed that the luminance of the light-emitting part 11 is α-fold of the maximum value, where α is a number smaller than 1. In such a case, for any gamma curve to be achieved, the light emission duty is multiplied by α in a gradation whose luminance becomes the α-fold, the gamma curve is made variable in such a manner as to allocate a step interval of an amplitude gradation in accordance with the gradation interval, and the gamma curve is made variable in such a manner that the amplitude gradation becomes the α-fold in at the interval. This makes it possible to achieve a luminance gamma characteristic of any gamma curve, as illustrated in FIG. 9B.

The luminance gamma characteristic having a shape of a logarithmic curve illustrated in FIG. 9A is an extremely advantageous characteristic for configuring a tiled display to be described below. The tiled display is a display device formed by arranging a plurality of display units (unit panels) in tiles. In the tiled display, if adjacent display units do not have respective gamma characteristics that are similar to each other, a luminance level difference occurs and a video quality deteriorates. Thus, the tiled display necessitates fine luminance control.

Therefore, the tiled display may include, as the display unit, the above-described display device in which the characteristic of the current versus the luminance is the gamma characteristic of the logarithmic curve to thereby make it possible to control the luminance over the entire area of the light emission current with a constant small change ratio with respect to the luminance. If it is possible to adjust the luminance, for example, at a luminance ratio of about 1.8%, the luminance level difference becomes less than or equal to the discrimination luminance difference of the human eye. Thus, it is possible to configure the tiled display having an excellent video quality with no luminance level difference between the adjacent display units.

It is known that the blue shift of the luminance of the light-emitting diode (LED) used as the light-emitting part 11 changes more in a lower current region. For this reason, as in the driving method according to Embodiment 3, it is very meaningful in terms of chromaticity change to execute the following: the gradation is expressed in such a manner that, in the gradation except for a minimum light emission duty, a minimum value of the light emission current is determined and the current value is reduced, and that the error diffusion or the like is used for the gradation lower than a minimum current in the minimum light emission duty; and the current value is used in such a manner that the gradation is adjusted at a current value higher than or equal to the minimum value. In the red light-emitting diode, the chromaticity change is small due to a characteristic of the material. However, the chromaticity change is large in each of the green and blue light-emitting diodes, and thus, it is possible to suppress the change in chromaticity to a small degree by performing control not to reduce the current value to less than or equal to the minimum current value in the low current region.

Incidentally, in a case where the light-emitting diode is used as the light-emitting element of the display device including a backplane in which it is difficult to use a large number of elements such as a TFT circuit, there are issues of the luminance variation in the low current region, a chromaticity change due to the light emission current, and the like. According to the driving method of Embodiment 3, however, it is possible to achieve driving which is resistant to noises and fluctuations even with a simple circuit configuration, and which has high gradation performance and no chromaticity change without use of, to a possible extent, the low current region that causes many issues in driving the light-emitting diode.

Embodiment 4

Embodiment 4 is an example of the driving method that performs chromaticity correction in a current region to be used for gradation control.

Figure 10A:
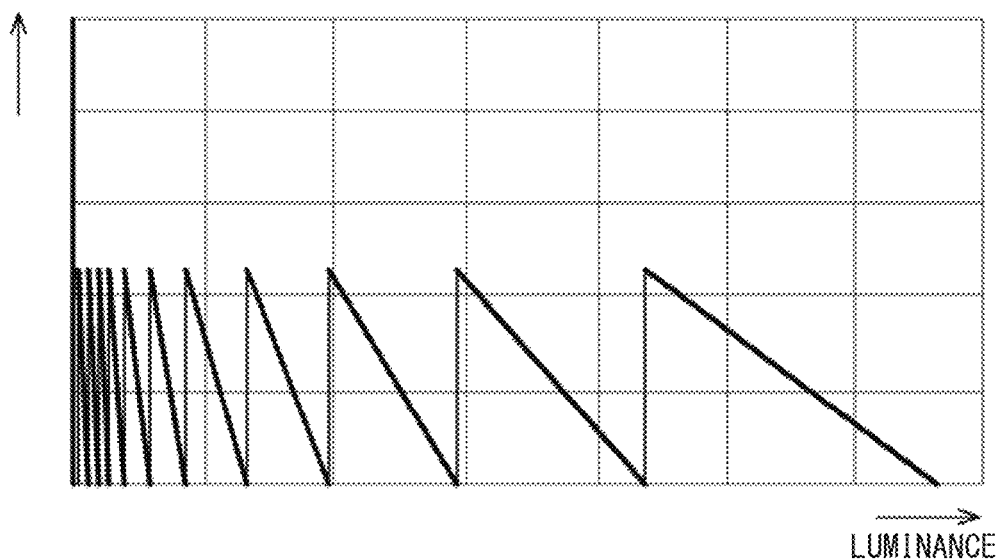
FIG. 10A is a characteristic diagram of a luminance versus a chromaticity of a case where chromaticity correction based on a driving method according to Embodiment 4 is not performed.

As described above, according to the driving method of Embodiment 3, it is possible to perform the gradation control using only the limited current range (the current range X illustrated in FIG. 7). However, although a color difference of the current region to be used repeatedly is smaller than a color difference of the low current region, the light-emitting part 11, or the light-emitting diode in particular, is not uninfluenced by the blue shift of the spectrum due to the light emission current. In a case where the chromaticity of a maximum usable current is used as a reference, the chromaticity difference (the color difference) in each gradation according to the driving method of Embodiment 3 are jagged due to the repeated use of the current region, as illustrated in FIG. 10A.

For a rigorous application of the display device, the chromaticity change due to the light emission current can cause issues such as banding. Thus, it is desirable to be able to completely correct the chromaticity change due to the light emission current in each gradation.

Figure 10B:
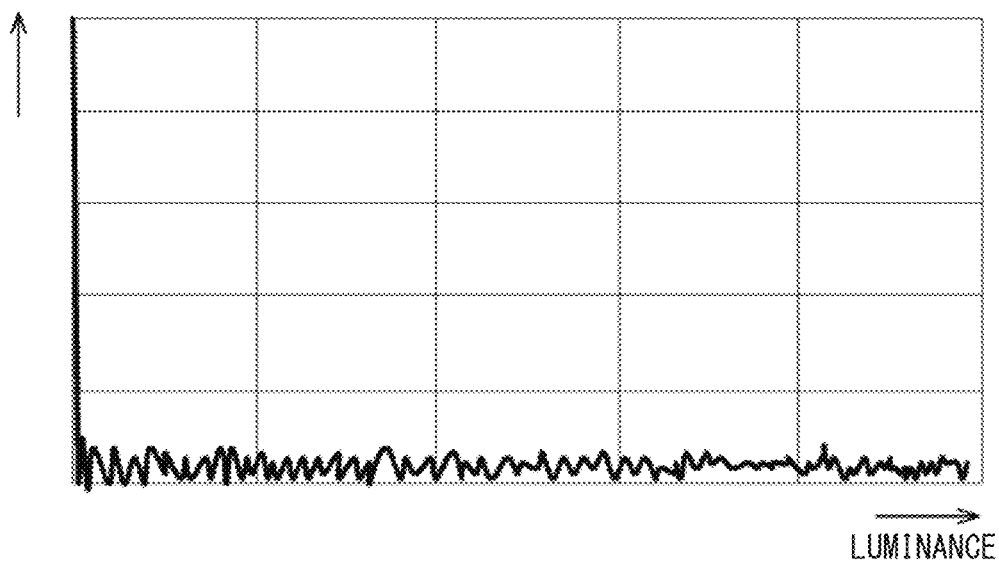
FIG. 10B is a characteristic diagram of a luminance versus a chromaticity of a case where chromaticity correction based on the driving method according to Embodiment 4 is performed.

According to the driving method of Embodiment 4, in the particular current range X to be used for the gradation control, chromaticity correction of a single color is performed under the control of the gradation controller 40. Specifically, as illustrated in FIG. 11, matrix chromaticity correction using different colors of R (red), G (green), and B (blue) is performed in two or more current values of the maximum current value and the minimum current value of the repeatedly used region in the current range X to be used for the gradation control. As described above, in the region between the maximum current value and the repeatedly used minimum current value, matrix linear chromaticity correction by linear interpolation of the matrices of the previous two points is performed, which makes it possible to suppress the change in chromaticity due to the light emission current in each gradation as illustrated in the characteristic diagram of the luminance versus chromaticity difference of FIG. 10B. In other words, it is apparent from a comparison between FIG. 10A and FIG. 10B that the driving method according to Embodiment 4 is able to perform almost exact chromaticity correction.

Embodiment 5

Figure 12:
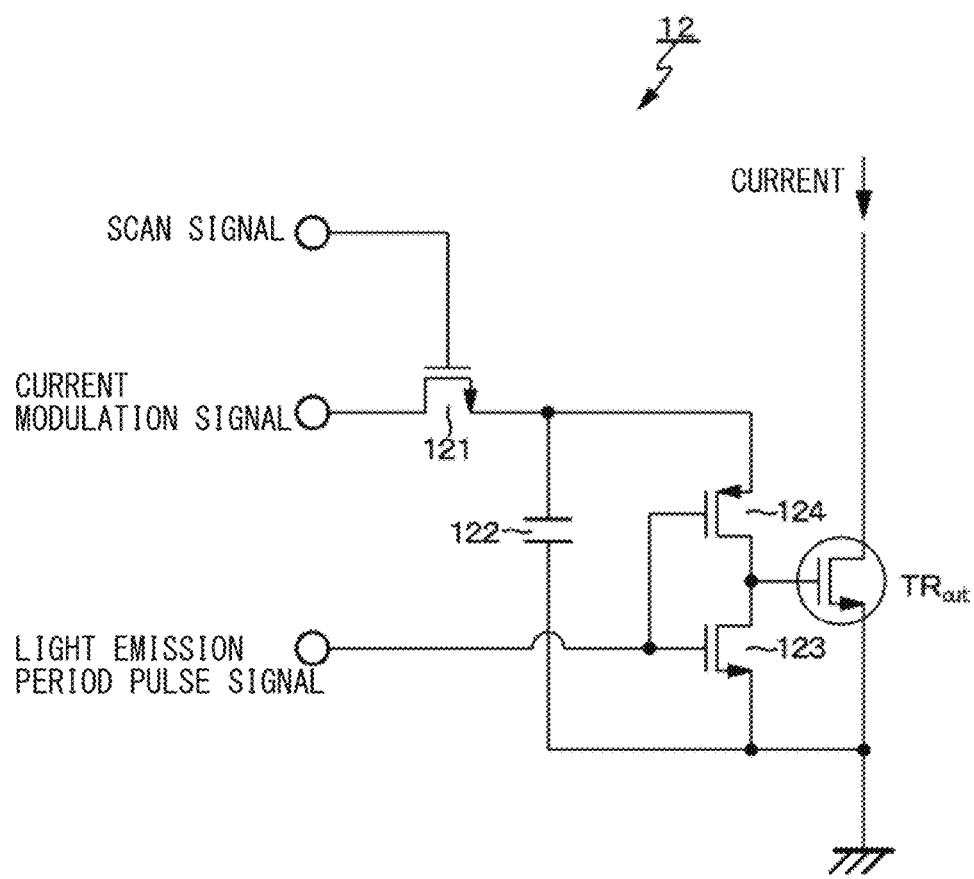
FIG. 12 is a circuit diagram illustrating a specific circuit example of a current modulator according to Embodiment 5.

Embodiment 5 is a specific circuit example of the current modulator 12 included in the pixel circuit 10 according to Embodiment 1. FIG. 12 illustrates the specific circuit example of the current modulator 12 according to Embodiment 5.

The current modulator 12 according to Embodiment 5 includes the output transistor $TR_{out}$ coupled in series to the light-emitting part 11, and in addition thereto, includes an N-channel field effect transistor 121, a capacitor 122, and a CMOS inverter including an N-channel field effect transistor 123 and a P-channel field effect transistor 124.

In the current modulator 12 having the above-described circuit configuration, the N-channel field effect transistor 121 is turned into an on-state by a scan signal Gate being applied to a gate electrode, and writes a current modulation signal I-Sig and holds the current modulation signal I-Sig in the capacitor 122. Thereafter, a light emission period pulse signal is inputted. The light emission period pulse signal controls the on/off of the output transistor $TR_{out}$.

Embodiment 6

Figure 13A:
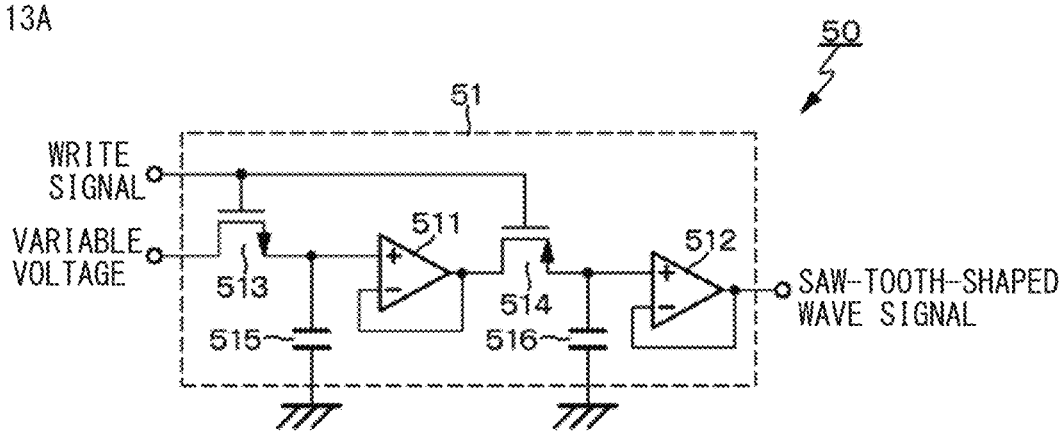
FIG. 13A is a block diagram illustrating a specific circuit example of a saw-tooth-shaped wave generator according to Embodiment 6.

Embodiment 6 is a specific circuit example and an operation waveform example of the saw-tooth-shaped wave generator 50. FIG. 13A illustrates the specific circuit example of the saw-tooth-shaped wave generator 50 according to Embodiment 6, and FIGS. 13B and 13C each illustrates the operation waveform example.

As described above, it is necessary that the saw-tooth-shaped wave generator 50 generate a saw-tooth-shaped wave signal SAW for each scan line. Accordingly, a circuit portion that generates the saw-tooth-shaped wave signal SAW is to be provided for each scan line. It is thus desired that the circuit portion be achieved by a simple circuit.

The circuit illustrated in FIG. 13A is the circuit portion provided for each scan line of the saw-tooth-shaped wave generator 50. The saw-tooth-shaped wave signal SAW to be generated by the saw-tooth-shaped wave generator 50 has a step-like waveform as illustrated in FIG. 2, and may thus be achieved by a sample hold circuit 51 that samples and holds the voltage. The sample hold circuit 51 includes, for example, two operational amplifiers 511 and 512, an N-channel field effect transistor 513, a P-channel field effect transistor 514, and two capacitors 515 and 516.

Figure 13B:
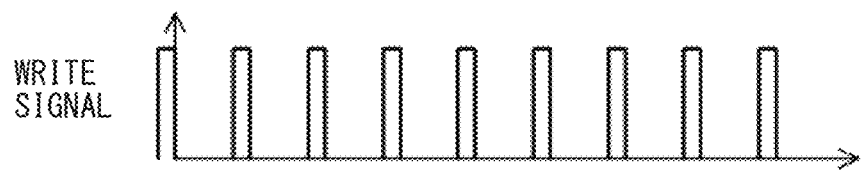
FIG. 13B and FIG. 13C are each a waveform diagram illustrating an example of an operation waveform example of the saw-tooth-shaped wave generator according to Embodiment 6.
Figure 13C:
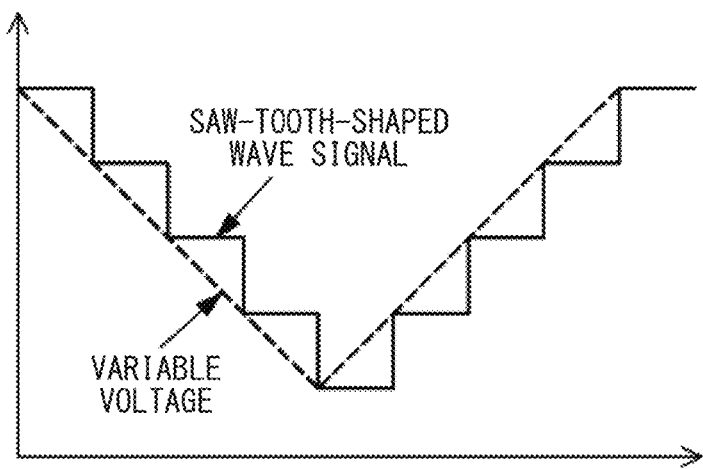

The sample hold circuit 51 is supplied with a write signal illustrated in FIG. 13B and a variable voltage indicated by a dashed line in FIG. 13C. The sample hold circuit 51 samples and holds the variable voltage in synchronization with the write signal to generate the saw-tooth-shaped wave signal SAW indicated by a solid line in FIG. 13C. It is possible to easily achieve the variable voltage by using a source driver or the like to be used in an organic EL display device or the like.

Embodiment 7

Embodiment 7 is an example of the driving method for maintaining a satisfactory moving-image characteristic when the light emission duty is discretely varied.

It is generally known that light emission duty greatly influences a moving image blur (a moving image distortion). For example, when the light emission duty changes rapidly, a pseudo contour may occur in a scrolling video of a stationary object or the like, or a blur level of a moving image may differ greatly depending on the luminance and appear unnatural.

In order to suppress this, it is preferable to suppress a change ratio of one light emission of the light emission duty to less than or equal to a predetermined proportion (e.g., 75%). Regarding a response to a moving of an eye, in a case where the light is emitted a plurality of times within one frame, it may be considered that the light emission duty is from the head of the light emission to the last light emission. Thus, a method of making the light emission duty variable by dividing the step-like waveform into a plurality of pieces.

Accordingly, in the driving method according to Embodiment 7, the light emission is partially divided, and the change ratio of one light emission of the light emission duty in the light emission period within one frame is suppressed to less than or equal to a predetermined proportion (for example, 75%), that is, a temporal change from light emission start to light emission end is made small in such a manner as not to involve an extreme light emission duty change, while maintaining the light emission duty as a whole.

Figure 14A:
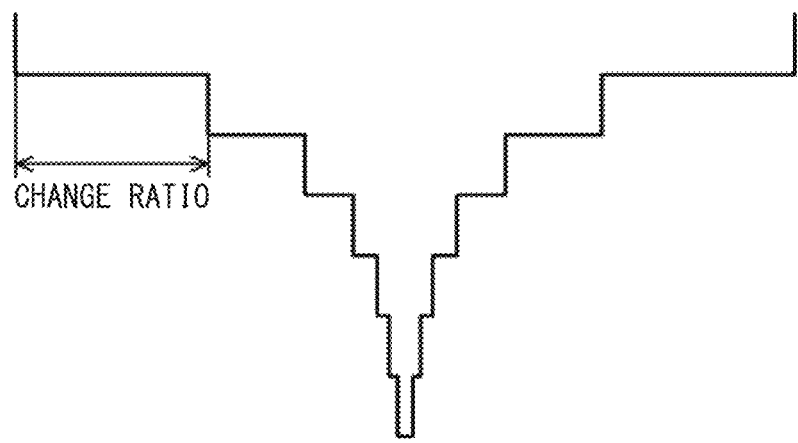
FIG. 14A is a waveform diagram of a saw-tooth-shaped wave signal SAW of a case involving an extreme light emission duty change between certain gradations.
Figure 14B:
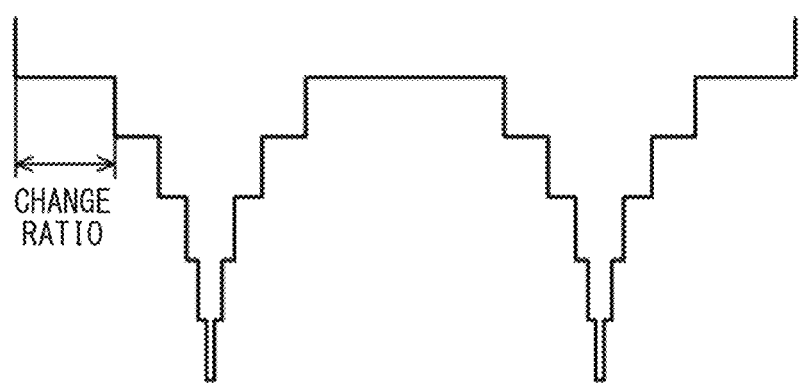
FIG. 14B is a waveform diagram of a saw-tooth-shaped wave signal SAW for achieving a driving method according to Embodiment 7.

FIG. 14A illustrates a waveform diagram of the saw-tooth-shaped wave signal SAW of a case involving the extreme light emission duty change between certain gradations. The waveform of FIG. 14A corresponds to the waveform of the step-like saw-tooth-shaped wave signal SAW illustrated in FIG. 2. FIG. 14B illustrates a waveform diagram of the saw-tooth-shaped wave signal SAW for achieving a driving method according to Embodiment 7. FIGS. 14A and 14B each illustrate the waveform of the saw-tooth-shaped wave signal SAW of a case where the light emission duty changes by 0.5-fold.

FIGS. 15A and 15B and FIGS. 16A and 16B illustrate moving image simulation results of 10-pixel/frame scroll video of a horizontal luminance ramp and a bar-shaped vertical ramp in the case where the light emission duty changes by 0.5-fold, of a case where the extreme light emission duty change between certain gradations is involved (one saw-tooth-shaped wave signal SAW), and of the case where the extreme light emission duty change is not involved (the saw-tooth-shaped wave signal SAW being divided into two parts). In the moving image simulation results illustrated in FIGS. 15A and 16A, which are the simulation results of the case of FIG. 14A having one saw-tooth-shaped wave signal SAW, that is, the case where the discrete light emission duty change is involved, it is apparent that the pseudo contour is observed in the horizontal ramp image, and that the blur level changes stepwise in the bar-shaped vertical ramp image.

Figure 15A:
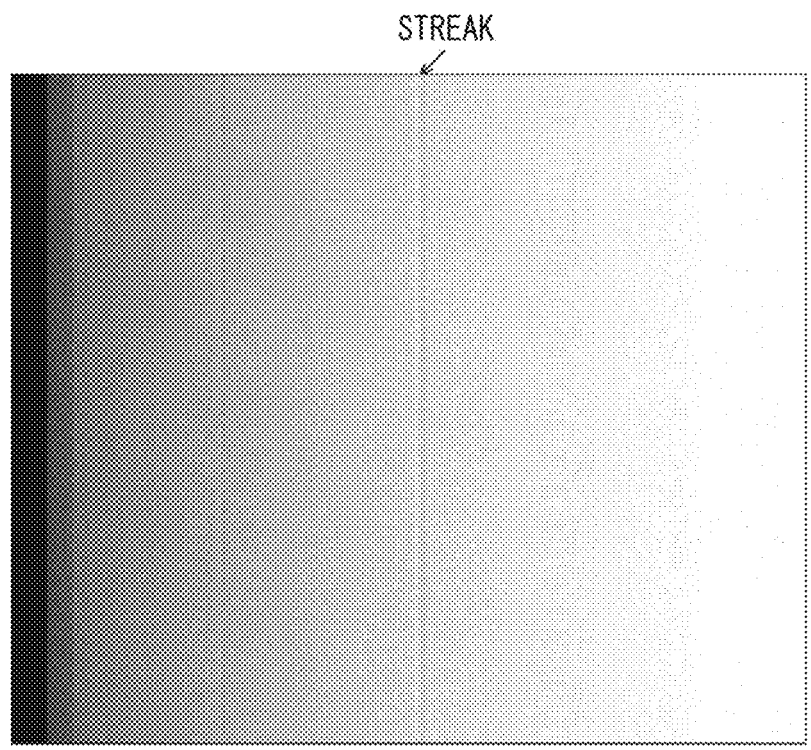
FIG. 15A is a diagram illustrating an image in scrolling of a rectangular figure of a case involving a discrete change of a light emission duty.
Figure 15B:
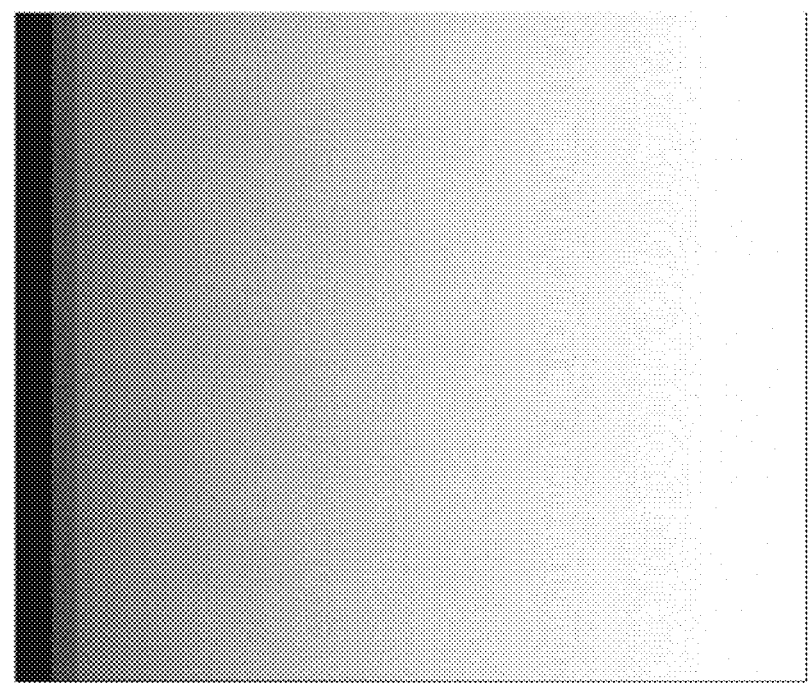
FIG. 15B is a diagram illustrating an image in scrolling of a ramp image of a case not involving the discrete change of the light emission duty.
Figure 16A:
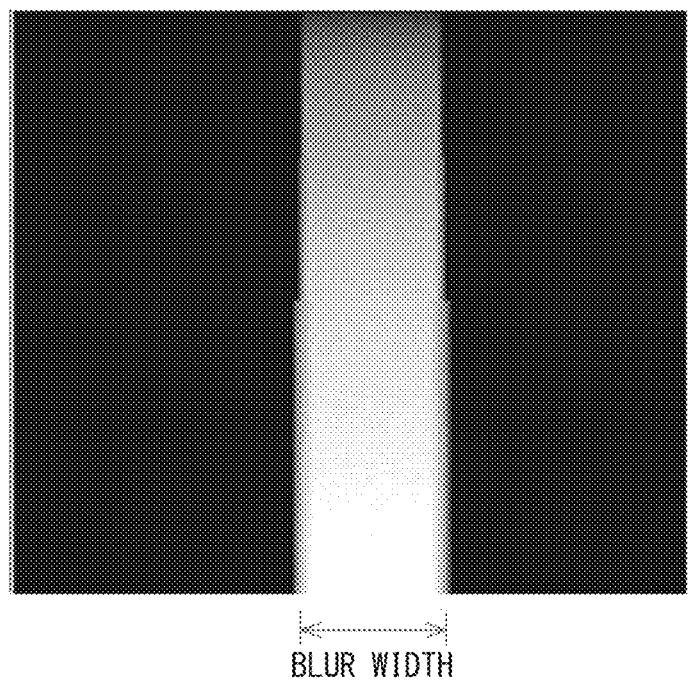
FIG. 16A is a diagram illustrating an image in scrolling of a rectangular figure of a case involving a discrete change of a light emission duty.
Figure 16B:
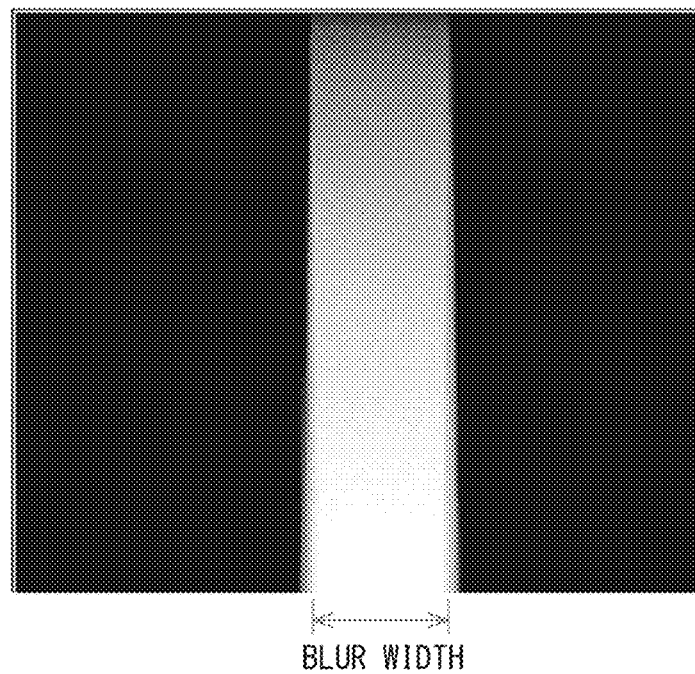
FIG. 16B is a diagram illustrating an image in scrolling of a rectangular figure of a case not involving the discrete change of the light emission duty.

The moving image simulation results of FIGS. 15B and 16B are simulation results of the case of FIG. 14B having the saw-tooth-shaped wave signal SAW which is divided into two parts, that is, the case where discrete change of light emission duty is not involved, under the driving by the driving method according to Embodiment 7. According to the driving method of Embodiment 7, it is apparent that the pseudo contour is greatly improved and the blur amount is also natural as compared with the case where discrete change of light emission duty is involved.

If further improvement is desired, there is considered a method of delicately changing a switching point of the level difference of the saw-tooth-shaped wave signal SAW for each frame and varying switching points of the light emission duty for each frame, to thereby blur the switching point of the pseudo contour depth or the moving image blur.

It is to be noted that, in the driving method according to Embodiment 7, reducing the temporal change from the light emission start to the light emission end and narrowing the light emission duty in the light emission period within one frame means that black is inserted. The insertion of black makes it possible to reduce the influence on the moving image blur (the moving image distortion).

Embodiment 8

Embodiment 8 is an example that has a re-shooting mode that achieves a strong light emission for re-shooting. The "re-shooting" means, for example, shooting an image displayed on a display device such as a large screen by an imaging device such as a CMOS image sensor.

Many imaging devices such as CMOS image sensors each employs a rolling shutter. The rolling shutter is exposed for each scan line, and therefore, in a case where an image displayed on a display device is shot (re-shot), if the display device does not emit light during the exposure, that portion is not exposed and a black band or the like may appear in a photograph. In order to prevent this by the PWM driving, light emission of the display device may be repetition of blinking at short intervals at equal intervals.

Figure 17A:
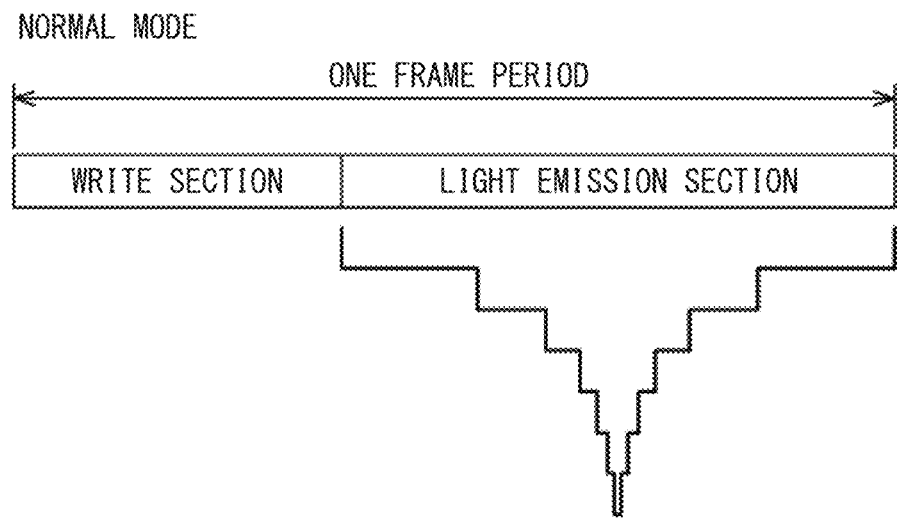
FIG. 17A is an explanatory diagram of an operation of a normal mode.
Figure 17B:
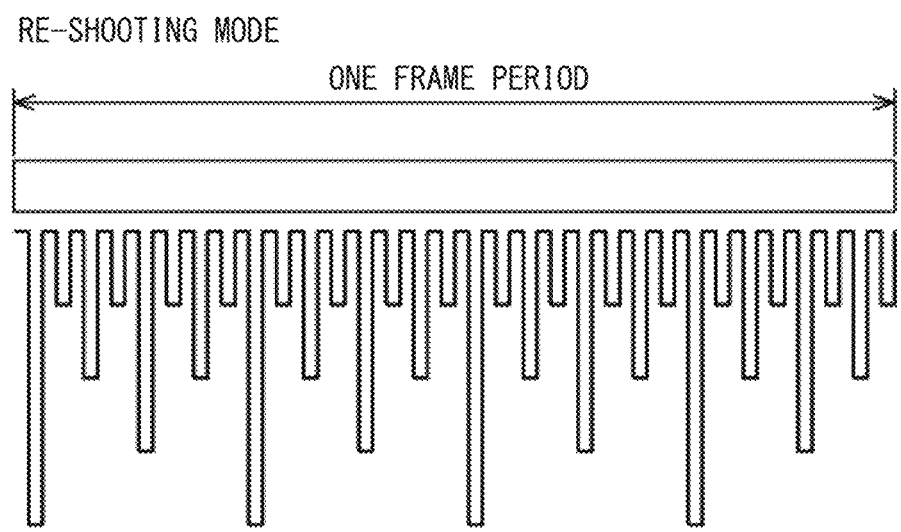
FIG. 17B is an explanatory diagram of an operation of a re-shooting mode according to Embodiment 8.

A display device according to Embodiment 8 has a re-shooting mode that achieves a strong light emission for re-shooting, in addition to a normal mode that performs control of discretely changing the light emission duty. In an operation of the normal mode, as illustrated in FIG. 17A, one frame period is divided into a write section and a light emission section, and the light emission duty is discretely changed in the light emission section. In contrast, in an operation of the re-shooting mode, as illustrated in FIG. 17B, the light emission in one frame period is divided into a plurality of times, and the light emission duty is not changed periodically.

In the normal mode, there is a section in which the light-emitting part 11 does not emit light, and in this section, the image is displayed in black, and when re-shooting is performed, the image is captured as a black streak, resulting in an image quality degradation of the captured image. In contrast, according to the re-shooting mode in the display device of Embodiment 8, the light-emitting part 11 is constantly emitting light, and it is thus possible to achieve a strong light emission for re-shooting, and to suppress generation of the issue of the moving image described in Embodiment 4.

Figure 18:
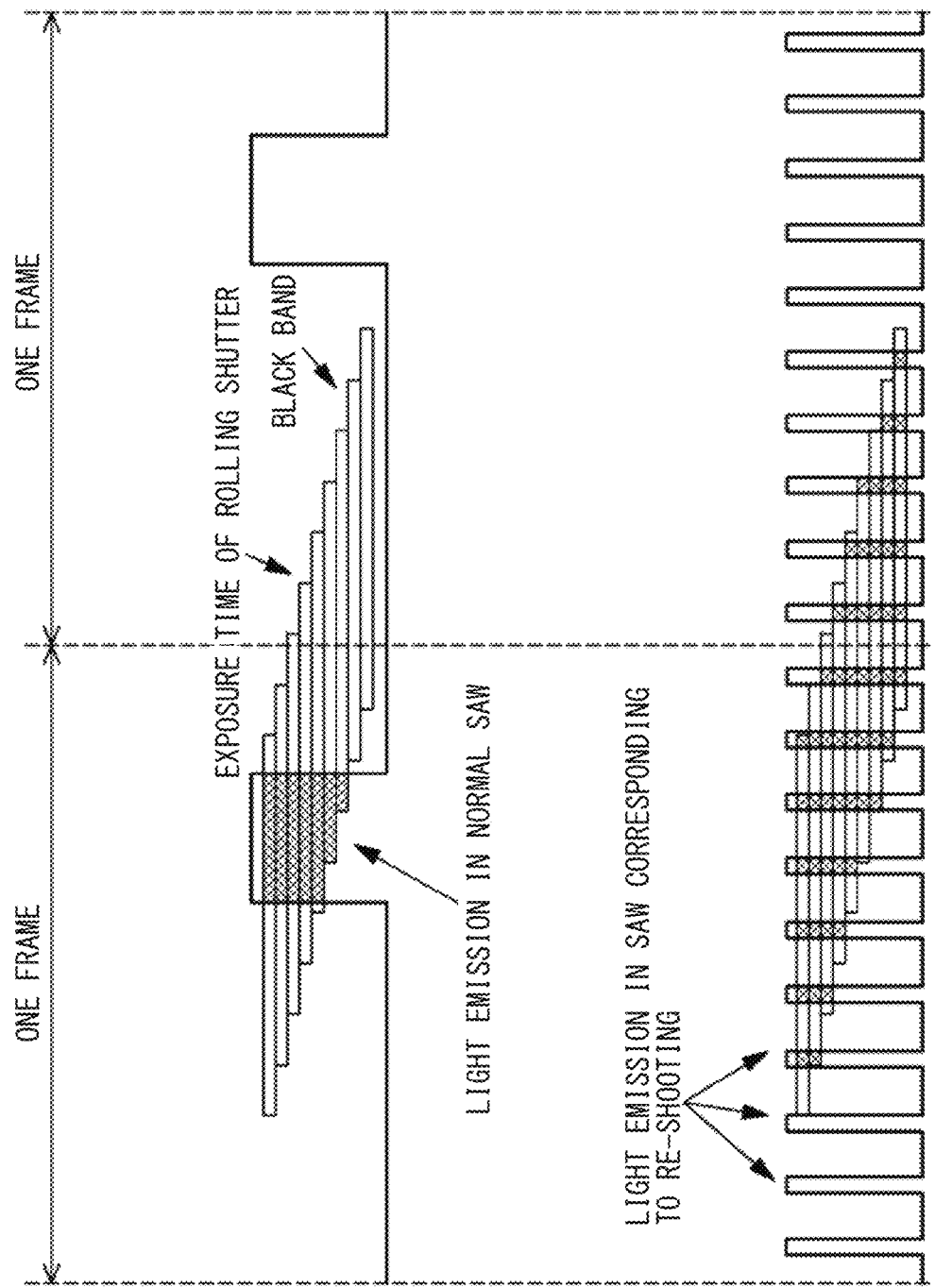
FIG. 18 is a timing waveform diagram illustrating a relationship between an exposure time of a rolling shutter and respective light emissions in the normal mode and the re-shooting mode.

FIG. 18 illustrates a relationship between an exposure time of the rolling shutter and the respective light emissions in the normal mode and the re-shooting mode. In FIG. 18, the light emission in the normal mode corresponding to the exposure time of the rolling shutter is illustrated by shading.

Embodiment 9

Figure 19:
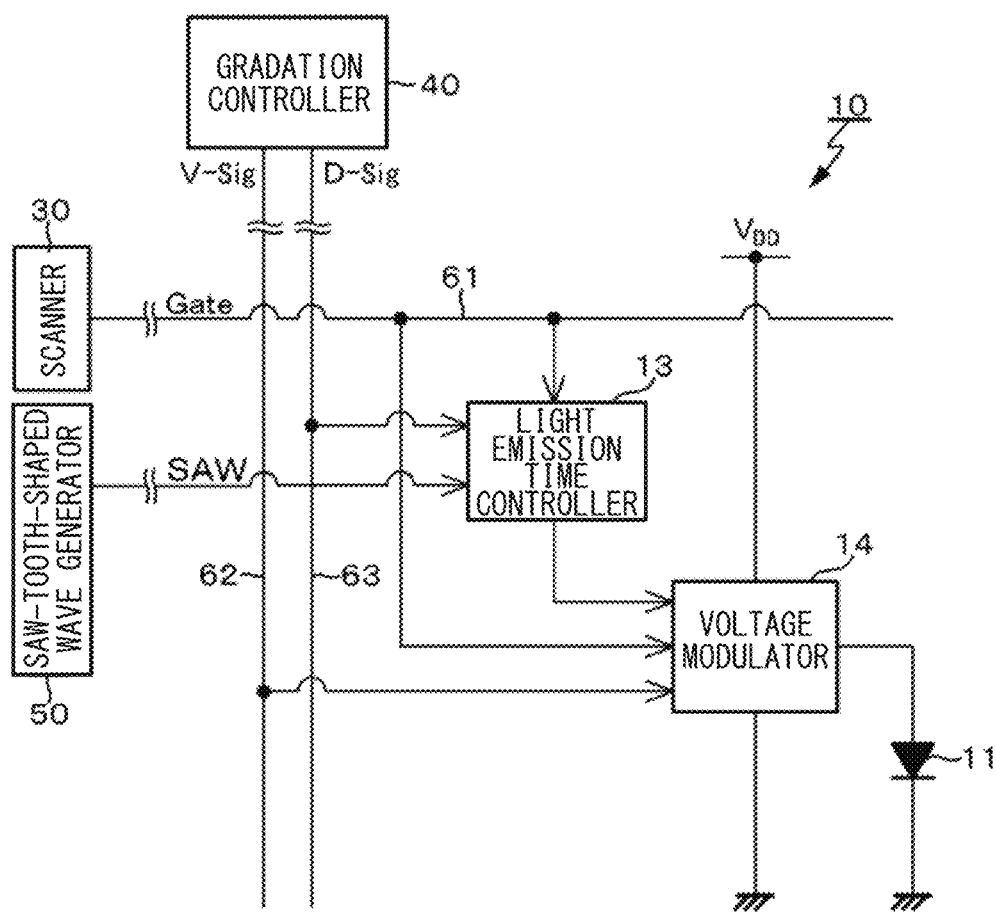
FIG. 19 is a circuit diagram illustrating an example of a circuit configuration of a pixel circuit according to Embodiment 9.

Embodiment 9 is a circuit example of the pixel circuit 10 for a case of voltage modulation. FIG. 19 illustrates an example of a circuit configuration of the pixel circuit 10 according to Embodiment 9.

In the case of the voltage modulation, the pixel circuit 10 has a circuit configuration including the light-emitting part 11, a voltage modulator 14, and the light emission time controller 13. In the case of the voltage modulation also, as with the case of the current modulation, a self-emitting element such as a light-emitting diode (LED) or an organic EL element may be used as a light-emitting element of the light-emitting part 11.

Figure 20:
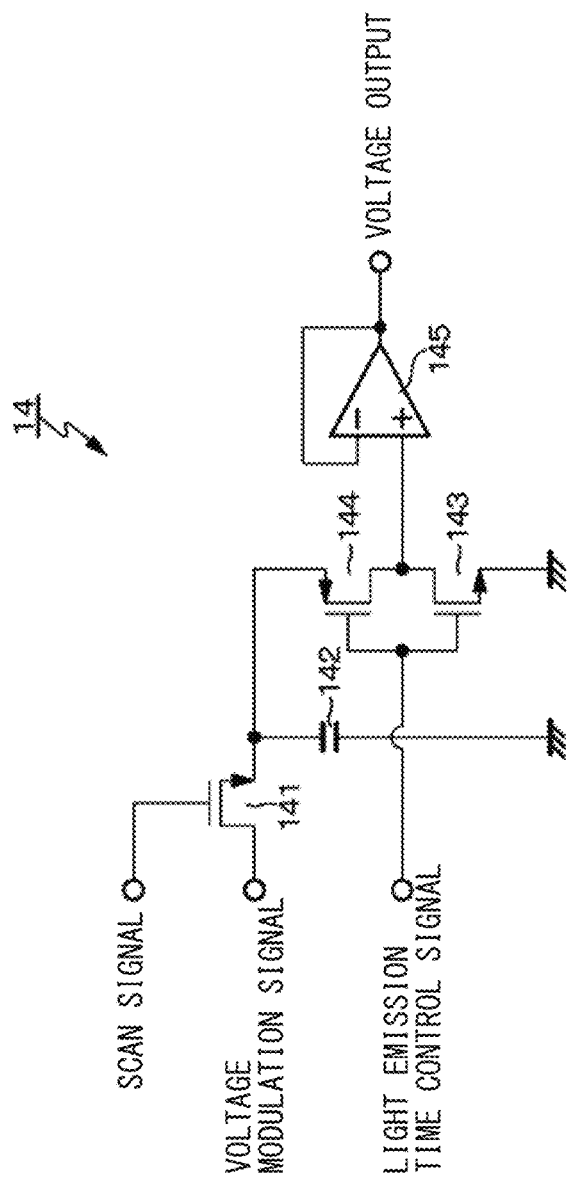
FIG. 20 is a circuit diagram illustrating a specific circuit example of a voltage modulator included in the pixel circuit according to Embodiment 9.

FIG. 20 illustrates a specific circuit example of the voltage modulator 14. The voltage modulator 14 according to the present circuit example includes: an N-channel field effect transistor 141, a capacitor 142, a CMOS inverter including an N-channel field effect transistor 143 and a P-channel field effect transistor 144, and an operational amplifier 145.

In the voltage modulator 14 having the above-described circuit configuration, an output transistor (not illustrated) of the operational amplifier 145 is to be coupled in series to the light-emitting part 11. The N-channel field effect transistor 141 is turned into an on-state by a scan signal Gate being applied to a gate electrode, and writes a voltage modulation signal V-Sig to be supplied from the gradation controller 40 and holds the voltage modulation signal V-Sig in the capacitor 142. Thereafter, a light emission period pulse signal is inputted. The light emission period pulse signal controls activation/deactivation of the operational amplifier 145 including the output transistor coupled in series to the light-emitting part 11.

As described above, the pixel circuit 10 according to Embodiment 9 has a configuration in which the light emission time is discretely determined for each pixel by controlling activation/deactivation of the operational amplifier 145 of the voltage modulator 14. The pixel circuit 10 according to Embodiment 9 having such a configuration, i.e., the pixel circuit 10 of the voltage modulation, is also able to have workings and effects similar to those of the pixel circuit 10 of the current modulation. In other words, it is possible to change the light emission time to be rough in a stepwise manner by the control of activation/deactivation of the operational amplifier 145, to perform the voltage modulation finely under the control of the gradation controller 40 in accordance with the light emission time determined by the control of activation/deactivation of the operational amplifier 145, and to achieve driving using only a current value in a particular range. it is possible to control the highly accurate circuit configuration. Thus, it becomes possible to control the light emission time with high accuracy even with a simple circuit configuration.

<Modification Example>

The technology of the present disclosure has been described above on the basis of the preferred embodiments, but the technology of the present disclosure is not limited to such embodiments. The configuration and the structure of the display device described in the above embodiments are examples, and may be changed as appropriate. For example, in the pixel circuit according to Embodiment 1, regarding the coupling relationship between the light-emitting part 11 and the current modulator 12, the circuit configuration is exemplified in which the light-emitting part 11 is disposed on the side of the power supply voltage $V_{DD}$ relative to the current modulator 12. However, the coupling relationship is not limited thereto. That is, a pixel circuit having a circuit configuration in which the light-emitting part 11 is disposed on the side of the reference potential node (for example, the ground) is also able to have similar workings and effects.

<Electronic Apparatus of Present Disclosure>

The display device according to the present disclosure described above is able to be used as a display (a display device) of an electronic apparatus of any field, which displays, as an image or a video, an image signal inputted to the electronic apparatus or an image signal generated inside the electronic apparatus. Examples of the electronic apparatus according to the present disclosure include a television set, a notebook personal computer, a digital still camera, a mobile terminal device such as a mobile phone, and a tiled display. However, the electronic apparatus is not limited thereto.

First Specific Example

Figure 21:
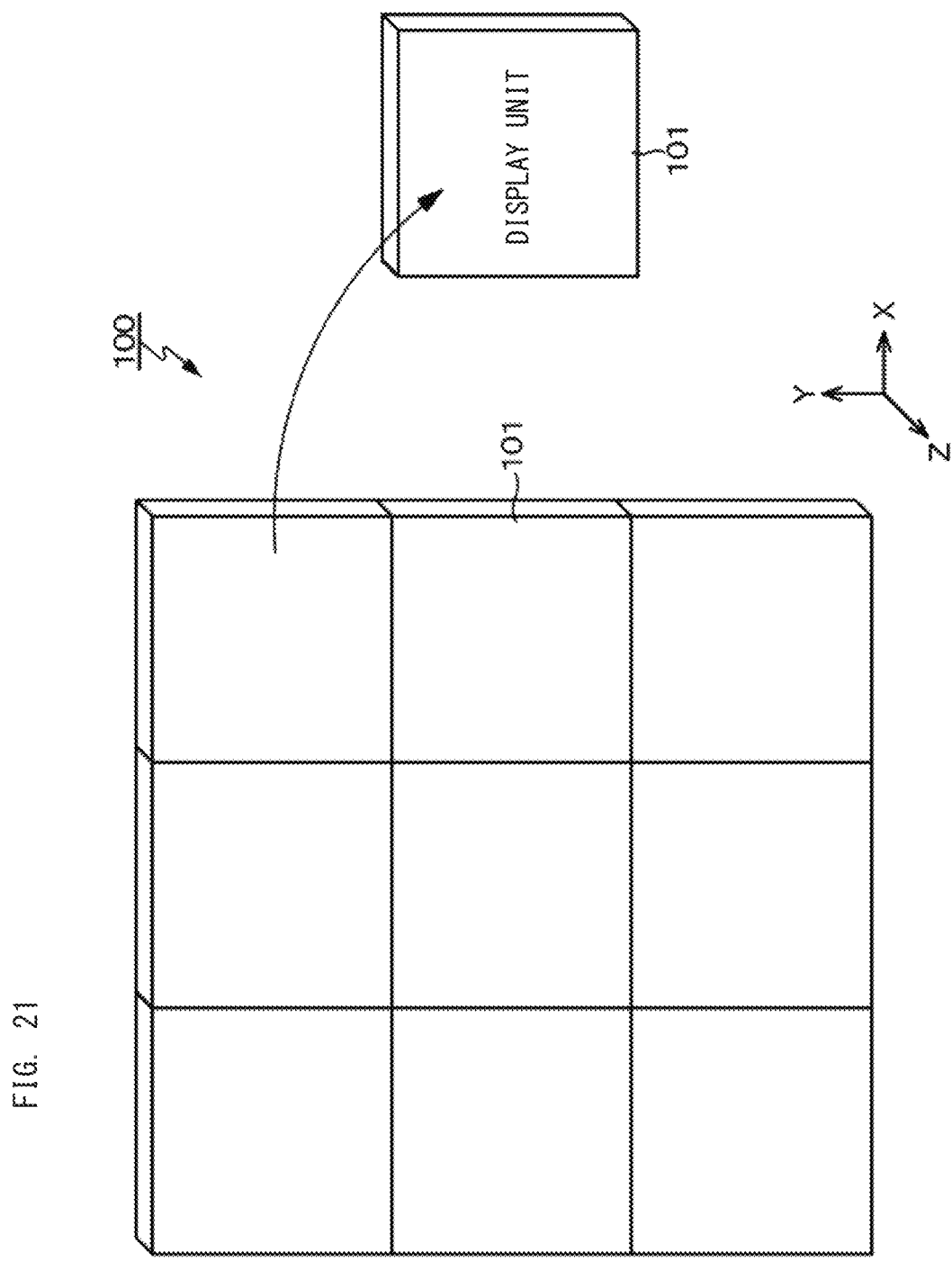
FIG. 21 is a schematic diagram illustrating a tiled display according to a first specific example of an electronic apparatus according to the present disclosure.

A first specific example of the electronic apparatus including the display device of the present disclosure is an example of a tiled display. FIG. 21 is a schematic diagram illustrating a tiled display according to a specific example of the electronic apparatus of the present disclosure.

A tiled display 100 according to the first specific example is, for example, a display device including a total of nine display units (unit panels) 101 in 3×3 which are tiled. Here, the number of display units 101 is 9 in total of 3×3, but the number of display units 101 is optional.

In the tiled display 100, if the adjacent display units 101 do not have respective gamma characteristics that are similar to each other, a luminance level difference occurs and a video quality deteriorates. Thus, the tiled display necessitates fine luminance control. Therefore, the tiled display 100 according to the first specific example includes, as the display unit 101, the light-emitting device according to the above-described embodiment in which the characteristic of the current versus the luminance is the gamma characteristic of the logarithmic curve. This makes it possible to control the luminance over the entire area of the light emission current with a constant small change ratio with respect to the luminance. If it is possible to adjust the luminance, for example, at a luminance ratio of about 1.8%, the luminance level difference becomes less than or equal to the discrimination luminance difference of the human eye. Thus, it is possible to provide the tiled display having an excellent video quality with no luminance level difference between the adjacent display units 101.

Second Specific Example

Figure 22:
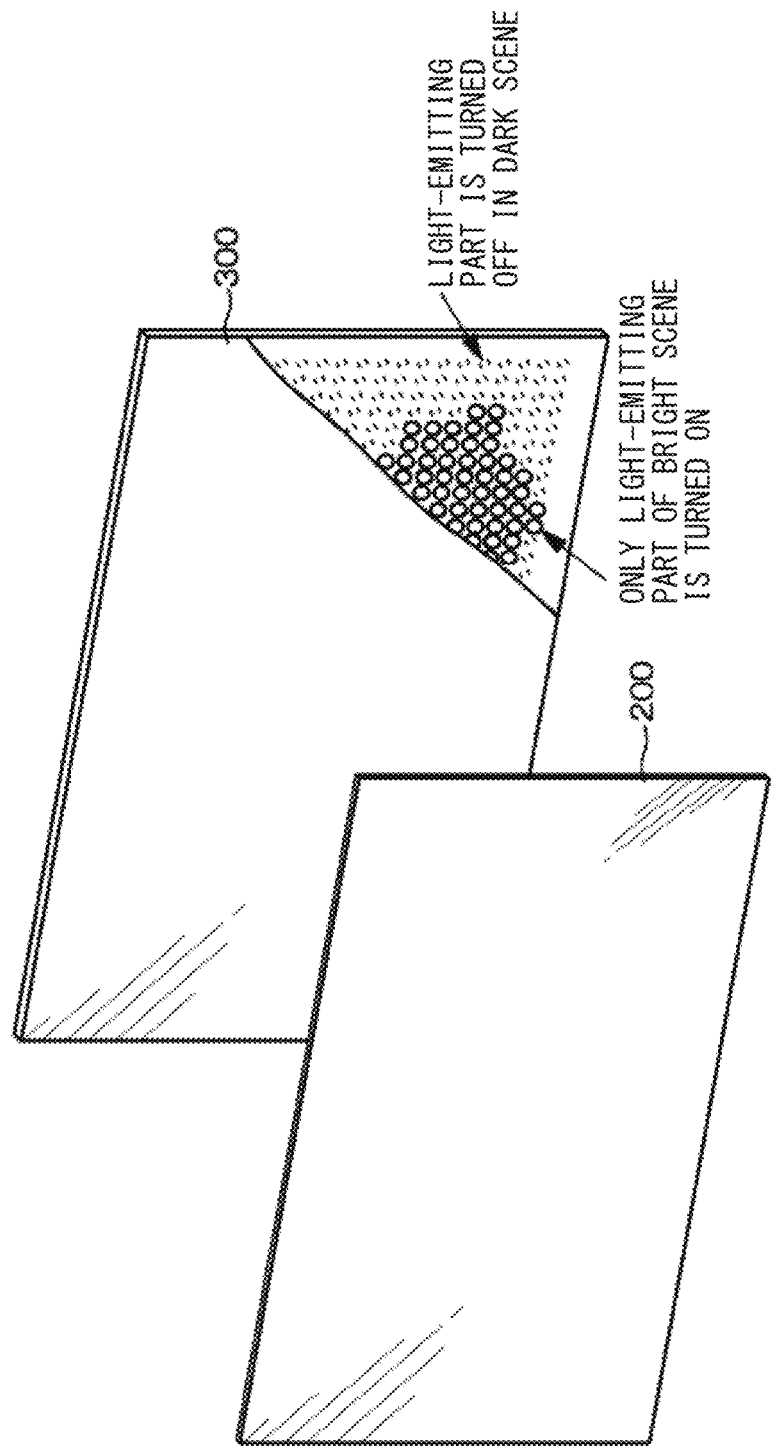
FIG. 22 is a schematic exploded perspective view of a liquid crystal display device according to a second specific example of the electronic apparatus according to the present disclosure.

A second specific example of the electronic apparatus including the display device of the present disclosure is an example of a back light device of a liquid crystal display device. FIG. 22 is a schematic exploded perspective view of the liquid crystal display device according to the second specific example of the electronic apparatus according to the present disclosure.

A liquid crystal display device 200 according to the second specific example has a configuration of a so-called direct LED partial driving in which a back light device 300 including a light-emitting diode (LED) as a light-emitting part is disposed on a rear surface. As the back light device 300 of the liquid crystal display device 200 of such a direct LED partial driving, the light-emitting device according to the above-described embodiment may be used. In the back light device 300, the partial driving in which only a light-emitting part (LED) of a bright scene is turned on and the light-emitting part (LED) is turned off in a dark scene is performed, thereby making it possible to provide the liquid crystal display device with excellent video quality.

<Configurations to Which Present Disclosure is Applicable>

It is to be noted that the present disclosure may have the following configurations.

<<A. Light-Emitting Device>>

[A-01] A light-emitting device including:
a pixel circuit including a light-emitting part; and
a gradation controller that performs gradation control, in which the pixel circuit includes
a light emission time controller that controls a light emission time of the light-emitting part, and
an amplitude modulator that includes an output transistor coupled in series to the light-emitting part, and
the gradation controller performs the gradation control by performing, via the light emission time controller, on/off control on the output transistor of the amplitude modulator, and modulation control on the amplitude modulator.

[A-02] The light-emitting device according to [A-01], in which
the light emission time controller discretely controls, under control of the gradation controller, the light emission time of the light-emitting part by performing the on/off control on the output transistor of the amplitude modulator, and
the amplitude modulator controls, under control of the gradation controller, a value of a current that flows through the light-emitting part or a value of a voltage that is applied to the light-emitting part depending on the light emission time of the light-emitting part.

[A-03] The light-emitting device according to [A-02], in which the amplitude modulator includes a current modulator that controls the value of the current that flows through the light-emitting part or a voltage modulator that controls the value of the voltage that is applied to the light-emitting part.

[A-04] The light-emitting device according to any one of [A-01] to [A-03], further including
a saw-tooth-shaped wave generator that generates a step-like saw-tooth-shaped wave signal, in which
the light emission time controller controls the light emission time of the light-emitting part on a basis of the step-like saw-tooth-shaped wave signal to be generated by the saw-tooth-shaped wave generator.

[A-05] The light-emitting device according to [A-04], in which
the saw-tooth-shaped wave generator generates the step-like saw-tooth-shaped wave signal for each of pixel rows of a pixel array in which pixel circuits are disposed in rows and columns, and
the light emission time controller controls the light emission time of the light-emitting part for each of the pixel rows on the basis of the step-like saw-tooth-shaped wave signal to be generated by the saw-tooth-shaped wave generator.

[A-06] The light-emitting device according to [A-04] or [A-05], in which the saw-tooth-shaped wave generator generates the step-like saw-tooth-shaped wave signal by a sample hold circuit.

[A-07] The light-emitting device according to any one of [A-01] to [A-06], in which the gradation controller discretely reduces the light emission time of the light-emitting part at a fixed rate.

[A-08] The light-emitting device according to [A-07], in which the gradation controller controls the light emission time of the light-emitting part and a value of a current that flows through the light-emitting part in such a manner that a characteristic of a current versus a luminance approaches a gamma characteristic of a logarithmic curve.

[A-09] The light-emitting device according to [A-07], in which,
where $\alpha$ is a number smaller than 1, and a luminance of the light-emitting part is $\alpha$-fold of a maximum value, for any gamma curve, the gradation controller multiplies a light emission duty by $\alpha$ in a gradation whose luminance becomes the $\alpha$-fold, makes the gamma curve variable in such a manner as to allocate a step interval of an amplitude gradation in accordance with the gradation interval, and makes the gamma curve variable in such a manner that the amplitude gradation becomes the α-fold in the interval.

[A-10] The light-emitting device according to any one of [A-02] to [A-09], in which the gradation controller sets a change ratio of one light emission of a light emission duty in a light emission period within one frame to less than or equal to a predetermined proportion, the change ratio being based on when the light emission time of the light-emitting part is discretely controlled.

[A-11] The light-emitting device according to any one of [A-02] to [A-10], in which the gradation controller uses a particular light emission current range of the light-emitting part except for a minimum light emission time width of the light-emitting part.

[A-12] The light-emitting device according to [A-11], in which the gradation controller performs chromaticity correction of a single color in a section of the particular current range of the light-emitting part.

[A-13] The light-emitting device according to [A-12], in which the gradation controller performs the chromaticity correction of the single color using a technique of an interpolation process.

[A-14] The light-emitting device according to [A-13], in which the gradation controller performs the chromaticity correction of the single color by the interpolation process of two or more current values.

[A-15] The light-emitting device according to any one of [A-01] to [A-14], in which the light-emitting device has a re-shooting mode in which light emission in one frame period is divided into a plurality of times, and a light emission duty is not changed periodically.

[A-16] The light-emitting device according to any one of [A-01] to [A-15], in which a light-emitting element of the light-emitting part includes a light-emitting diode.

<<B. Method of Driving Light-Emitting Device>>

[B-01] A method of driving a light-emitting device,
the light-emitting device including
a pixel circuit including a light-emitting part, and
a gradation controller that performs gradation control,
the pixel circuit including
a light emission time controller that controls a light emission time of the light-emitting part, and
an amplitude modulator that includes an output transistor coupled in series to the light-emitting part,
the method including, in driving the light-emitting device, performing the gradation control by performing on/off control on the output transistor of the amplitude modulator, and by performing modulation control on the amplitude modulator, under control of the gradation controller.

[B-02] The light-emitting device according to [B-01], in which the light emission time of the light-emitting part is controlled on a basis of a step-like saw-tooth-shaped wave signal.

[B-03] The light-emitting device according to [B-02], in which the light emission time of the light-emitting part is controlled for each of pixel rows on the basis of the step-like saw-tooth-shaped wave signal.

[B-04] The light-emitting device according to any one of [B-01] to [B-03], in which the gradation controller discretely reduces the light emission time of the light-emitting part at a fixed rate.

[B-05] The light-emitting device according to [B-04], in which the gradation controller controls the light emission time of the light-emitting part and a value of a current that flows through the light-emitting part in such a manner that a characteristic of a current versus a luminance approaches a gamma characteristic of a logarithmic curve.

[B-06] The light-emitting device according to [B-06], in which,
where α is a number smaller than 1, and a luminance of the light-emitting part is α-fold of a maximum value,
for any gamma curve, the light-emitting device multiplies a light emission duty by α in a gradation whose luminance becomes the α-fold, makes the gamma curve variable in such a manner as to allocate a step interval of an amplitude gradation in accordance with the gradation interval, and makes the gamma curve variable in such a manner that the amplitude gradation becomes the α-fold in the interval.

[B-07] The light-emitting device according to any one of [B-01] to [B-06], in which the light-emitting device sets a change ratio of one light emission of a light emission duty in a light emission period within one frame to less than or equal to a predetermined proportion, the change ratio being based on when the light emission time of the light-emitting part is discretely controlled.

[B-08] The light-emitting device according to any one of [B-02] to [B-07], in which the light-emitting device uses a particular light emission current range of the light-emitting part except for a minimum light emission time width of the light-emitting part.

[B-09] The light-emitting device according to [B-08], in which the light-emitting device performs chromaticity correction of a single color in a section of the particular current range of the light-emitting part.

[B-10] The light-emitting device according to [B-09], in which the light-emitting device performs the chromaticity correction of the single color using a technique of an interpolation process.

[B-11] The light-emitting device according to [B-10], in which the light-emitting device performs the chromaticity correction of the single color by the interpolation process of two or more current values.

[B-12] The light-emitting device according to any one of [B-01] to [B-11], in which the light-emitting device has a re-shooting mode in which light emission in one frame period is divided into a plurality of times, and a light emission duty is not changed periodically.

[B-13] The light-emitting device according to any one of [B-01] to [B-12], in which a light-emitting element of the light-emitting part includes a light-emitting diode.

<<C. Electronic Apparatus>>

[C-01] An electronic apparatus including a light-emitting device, the light-emitting device including:
a pixel circuit including a light-emitting part; and
a gradation controller that performs gradation control, in which
the pixel circuit includes
a light emission time controller that controls a light emission time of the light-emitting part, and
an amplitude modulator that includes an output transistor coupled in series to the light-emitting part, and
the gradation controller performs the gradation control by performing, via the light emission time controller, on/off control on the output transistor of the amplitude modulator, and modulation control on the amplitude modulator.

[C-02] The electronic apparatus according to [C-01], in which
the light emission time controller discretely controls, under control of the gradation controller, the light emission time of the light-emitting part by performing the on/off control on the output transistor of the amplitude modulator, and
the amplitude modulator controls, under control of the gradation controller, a value of a current that flows through the light-emitting part or a value of a voltage that is applied to the light-emitting part depending on the light emission time of the light-emitting part.

[C-03] The electronic apparatus according to [C-02], in which the amplitude modulator includes a current modulator that controls the value of the current that flows through the light-emitting part or a voltage modulator that controls the value of the voltage that is applied to the light-emitting part.

[C-04] The electronic apparatus according to any one of [C-01] to [C-03], further including
a saw-tooth-shaped wave generator that generates a step-like saw-tooth-shaped wave signal, in which
the light emission time controller controls the light emission time of the light-emitting part on a basis of the step-like saw-tooth-shaped wave signal to be generated by the saw-tooth-shaped wave generator.

[C-05] The electronic apparatus according to [C-04], in which
the saw-tooth-shaped wave generator generates the step-like saw-tooth-shaped wave signal for each of pixel rows of a pixel array in which pixel circuits are disposed in rows and columns, and
the light emission time controller controls the light emission time of the light-emitting part for each of the pixel rows on the basis of the step-like saw-tooth-shaped wave signal to be generated by the saw-tooth-shaped wave generator.

[C-06] The electronic apparatus according to [C-04] or [C-05], in which the saw-tooth-shaped wave generator generates the step-like saw-tooth-shaped wave signal by a sample hold circuit.

[C-07] The electronic apparatus according to any one of [C-01] to [C-06], in which the gradation controller discretely reduces the light emission time of the light-emitting part at a fixed rate.

[C-08] The electronic apparatus according to [C-07], in which the gradation controller controls the light emission time of the light-emitting part and a value of a current that flows through the light-emitting part in such a manner that a characteristic of a current versus a luminance approaches a gamma characteristic of a logarithmic curve.

[C-09] The electronic apparatus according to [C-07], in which,
where $\alpha$ is a number smaller than 1, and a luminance of the light-emitting part is $\alpha$-fold of a maximum value,
for any gamma curve, the gradation controller multiplies a light emission duty by $\alpha$ in a gradation whose luminance becomes the $\alpha$-fold, makes the gamma curve variable in such a manner as to allocate a step interval of an amplitude gradation in accordance with the gradation interval, and makes the gamma curve variable in such a manner that the amplitude gradation becomes the $\alpha$-fold in the interval.

[C-10] The electronic apparatus according to any one of [C-02] to [C-09], in which the gradation controller sets a change ratio of one light emission of a light emission duty in a light emission period within one frame to less than or equal to a predetermined proportion, the change ratio being based on when the light emission time of the light-emitting part is discretely controlled.

[C-11] The electronic apparatus according to any one of [C-02] to [C-10], in which the gradation controller uses a particular light emission current range of the light-emitting part except for a minimum light emission time width of the light-emitting part.

[C-12] The electronic apparatus according to [C-11], in which the gradation controller performs chromaticity correction of a single color in a section of the particular current range of the light-emitting part.

[C-13] The electronic apparatus according to [C-12], in which the gradation controller performs the chromaticity correction of the single color using a technique of an interpolation process.

[C-14] The electronic apparatus according to [C-13], in which the gradation controller performs the chromaticity correction of the single color by the interpolation process of two or more current values.

[C-15] The electronic apparatus according to any one of [C-01] to [C-14], in which the electronic apparatus has a re-shooting mode in which light emission in one frame period is divided into a plurality of times, and a light emission duty is not changed periodically.

[C-16] The electronic apparatus according to any one of [C-01] to [C-15], in which a light-emitting element of the light-emitting part includes a light-emitting diode.

This application claims the benefit of Japanese Priority Patent Application JP2020-187090 filed with the Japan Patent Office on Nov. 10, 2020, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

What is claimed is:

1. A light-emitting device, comprising:
a pixel circuit including a light-emitting part; and
a gradation controller that performs gradation control, wherein
the pixel circuit includes
a light emission time controller that controls a light emission time of the light-emitting part, and
an amplitude modulator that includes an output transistor coupled in series to the light-emitting part, and
the gradation controller performs the gradation control by performing, via the light emission time controller, on/off control on the output transistor of the amplitude modulator, and modulation control on the amplitude modulator,
wherein the gradation controller discretely reduces the light emission time of the light-emitting part at a fixed rate, and
wherein the gradation controller controls the light emission time of the light-emitting part and a value of a current that flows through the light-emitting part in such a manner that a characteristic of a current versus a luminance approaches a gamma characteristic of a logarithmic curve.

2. The light-emitting device according to claim 1, wherein
the light emission time controller discretely controls, under control of the gradation controller, the light emission time of the light-emitting part by performing the on/off control on the output transistor of the amplitude modulator, and the amplitude modulator controls, under control of the gradation controller, a value of a current that flows through the light-emitting part or a value of a voltage that is applied to the light-emitting part depending on the light emission time of the light-emitting part.

3. The light-emitting device according to claim 2, wherein the amplitude modulator comprises a current modulator that controls the value of the current that flows through the light-emitting part or a voltage modulator that controls the value of the voltage that is applied to the light-emitting part.

4. The light-emitting device according to claim 2, wherein the gradation controller sets a change ratio of one light emission of a light emission duty in a light emission period within one frame to less than or equal to a predetermined proportion, the change ratio being based on when the light emission time of the light-emitting part is discretely controlled.

5. The light-emitting device according to claim 2, wherein the gradation controller uses a particular light emission current range of the light-emitting part except for a minimum light emission time width of the light-emitting part.

6. The light-emitting device according to claim 5, wherein the gradation controller performs chromaticity correction of a single color in a section of the particular current range of the light-emitting part.

7. The light-emitting device according to claim 6, wherein the gradation controller performs the chromaticity correction of the single color using a technique of an interpolation process.

8. The light-emitting device according to claim 7, wherein the gradation controller performs the chromaticity correction of the single color by the interpolation process of two or more current values.

9. The light-emitting device according to claim 1, further comprising
a saw-tooth-shaped wave generator that generates a step-like saw-tooth-shaped wave signal, wherein
the light emission time controller controls the light emission time of the light-emitting part on a basis of the step-like saw-tooth-shaped wave signal to be generated by the saw-tooth-shaped wave generator.

10. The light-emitting device according to claim 9, wherein
the saw-tooth-shaped wave generator generates the step-like saw-tooth-shaped wave signal for each of pixel rows of a pixel array in which pixel circuits are disposed in rows and columns, and
the light emission time controller controls the light emission time of the light-emitting part for each of the pixel rows on the basis of the step-like saw-tooth-shaped wave signal to be generated by the saw-tooth-shaped wave generator.

11. The light-emitting device according to claim 9, wherein the saw-tooth-shaped wave generator generates the step-like saw-tooth-shaped wave signal by a sample hold circuit.

12. The light-emitting device according to claim 1, wherein,
where α is a number smaller than 1, and a luminance of the light-emitting part is α-fold of a maximum value,
for any gamma curve, the gradation controller multiplies a light emission duty by α in a gradation whose luminance becomes the α-fold, makes the gamma curve variable in such a manner as to allocate a step interval of an amplitude gradation in accordance with the gradation interval, and makes the gamma curve variable in such a manner that the amplitude gradation becomes the α-fold in the interval.

13. The light-emitting device according to claim 1, wherein the light-emitting device has a re-shooting mode in which light emission in one frame period is divided into a plurality of times, and a light emission duty is not changed periodically.

14. The light-emitting device according to claim 1, wherein a light-emitting element of the light-emitting part comprises a light-emitting diode.

15. A method of driving a light-emitting device,
the light-emitting device including
a pixel circuit including a light-emitting part, and
a gradation controller that performs gradation control,
the pixel circuit including
a light emission time controller that controls a light emission time of the light-emitting part, and
an amplitude modulator that includes an output transistor coupled in series to the light-emitting part,
the method comprising, in driving the light-emitting device, performing the gradation control by performing on/off control on the output transistor of the amplitude modulator, and by performing modulation control on the amplitude modulator, under control of the gradation controller,
wherein the gradation controller discretely reduces the light emission time of the light-emitting part at a fixed rate, and
wherein the gradation controller controls the light emission time of the light-emitting part and a value of a current that flows through the light-emitting part in such a manner that a characteristic of a current versus a luminance approaches a gamma characteristic of a logarithmic curve.

16. An electronic apparatus comprising a light-emitting device, the light-emitting device including:
a pixel circuit including a light-emitting part; and
a gradation controller that performs gradation control, wherein
the pixel circuit includes
a light emission time controller that controls a light emission time of the light-emitting part, and
an amplitude modulator that includes an output transistor coupled in series to the light-emitting part, and
the gradation controller performs the gradation control by performing, via the light emission time controller, on/off control on the output transistor of the amplitude modulator, and modulation control on the amplitude modulator,
wherein the gradation controller discretely reduces the light emission time of the light-emitting part at a fixed rate, and
wherein the gradation controller controls the light emission time of the light-emitting part and a value of a current that flows through the light-emitting part in such a manner that a characteristic of a current versus a luminance approaches a gamma characteristic of a logarithmic curve.

17. The electronic apparatus according to claim 16, wherein,
where α is a number smaller than 1, and a luminance of the light-emitting part is α-fold of a maximum value,
for any gamma curve, the gradation controller multiplies a light emission duty by α in a gradation whose luminance becomes the α-fold, makes the gamma curve variable in such a manner as to allocate a step interval of an amplitude gradation in accordance with the gradation interval, and makes the gamma curve variable in such a manner that the amplitude gradation becomes the α-fold in the interval.

18. The electronic apparatus according to claim 16, wherein the light emission time controller discretely controls, under control of the gradation controller, the light emission time of the light-emitting part by performing the on/off control on the output transistor of the amplitude modulator, and the amplitude modulator controls, under control of the gradation controller, a value of a current that flows through the light-emitting part or a value of a voltage that is applied to the light-emitting part depending on the light emission time of the light-emitting part.

19. The electronic apparatus according to claim 18, wherein the gradation controller sets a change ratio of one light emission of a light emission duty in a light emission period within one frame to less than or equal to a predetermined proportion, the change ratio being based on when the light emission time of the light-emitting part is discretely controlled.

20. The electronic apparatus according to claim 18, wherein the gradation controller uses a particular light emission current range of the light-emitting part except for a minimum light emission time width of the light-emitting part.

* * * * *